(12) United States Patent
Tak et al.

(10) Patent No.: US 9,728,644 B2
(45) Date of Patent: Aug. 8, 2017

(54) SEMICONDUCTOR DEVICE INCLUDING FIELD EFFECT TRANSISTORS

(71) Applicant: SAMSUNG ELECTRONICS CO., LTD., Suwon-si, Gyeonggi-do (KR)

(72) Inventors: Yong-Suk Tak, Seoul (KR); Jongryeol Yoo, Osan-si (KR); Hyun Jung Lee, Suwon-si (KR); Miseon Park, Daegu (KR); Bonyoung Koo, Suwon-si (KR); Sunjung Kim, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/093,892

(22) Filed: Apr. 8, 2016

(65) Prior Publication Data
US 2016/0336450 A1    Nov. 17, 2016

(30) Foreign Application Priority Data
May 14, 2015   (KR) ........................ 10-2015-0067546

(51) Int. Cl.
| H01L 29/00 | (2006.01) |
| H01L 29/78 | (2006.01) |
| H01L 29/08 | (2006.01) |
| H01L 29/66 | (2006.01) |
| H01L 29/165 | (2006.01) |

(52) U.S. Cl.
CPC ...... *H01L 29/7851* (2013.01); *H01L 29/0847* (2013.01); *H01L 29/66545* (2013.01); *H01L 29/7848* (2013.01); *H01L 29/7849* (2013.01); *H01L 29/165* (2013.01)

(58) Field of Classification Search
CPC ............ H01L 29/7851; H01L 29/7848; H01L 29/7849; H01L 29/0847; H01L 29/66545; H01L 29/165
See application file for complete search history.

(56) References Cited

U.S. PATENT DOCUMENTS

| 7,288,828 B2 | 10/2007 | Lin et al. |
| 7,759,199 B2 | 7/2010 | Thomas et al. |
| 7,838,887 B2 | 11/2010 | Woon et al. |
| 8,264,032 B2 | 9/2012 | Yeh et al. |
| 8,338,259 B2 | 12/2012 | Wu et al. |
| 8,575,653 B2 * | 11/2013 | Rachmady ............ B82Y 10/00 257/192 |

(Continued)

FOREIGN PATENT DOCUMENTS

| JP | 2008-078519 A | 4/2008 |
| KR | 10-2013-0111592 A | 10/2013 |

*Primary Examiner* — Nikolay Yushin
(74) *Attorney, Agent, or Firm* — Lee & Morse P.C.

(57) ABSTRACT

A semiconductor device includes a fin structure on a substrate and extending in a first direction, a gate electrode crossing over the fin structure, source/drain regions on the fin structure at opposite sides of the gate electrode, and a barrier layer between the fin structure and each of the source/drain regions. The fin structure includes a material having a lattice constant different from that of the substrate, the fin structure, the source/drain regions, and the barrier layer include germanium, and a germanium concentration in the barrier layer is greater than that in the fin structure and less than a maximum germanium concentration in each of the source/drain regions.

19 Claims, 19 Drawing Sheets

(56) References Cited

U.S. PATENT DOCUMENTS

| | | |
|---|---|---|
| 8,659,089 B2 | 2/2014 | Ko et al. |
| 8,679,910 B2 | 3/2014 | Ming et al. |
| 8,716,090 B2 | 5/2014 | Qin et al. |
| 8,901,537 B2 | 12/2014 | Murthy et al. |
| 9,425,257 B2 * | 8/2016 | Fung .................... H01L 29/785 |
| 2005/0263795 A1 | 12/2005 | Choi et al. |
| 2014/0077279 A1 | 3/2014 | Tu |
| 2014/0335674 A1 | 11/2014 | Liao et al. |
| 2014/0361339 A1 | 12/2014 | Liu |

\* cited by examiner

3000

4000

SEMICONDUCTOR DEVICE INCLUDING FIELD EFFECT TRANSISTORS

CROSS-REFERENCE TO RELATED APPLICATION

Korean Patent Application No. 10-2015-0067546, filed on May 14, 2015, in the Korean Intellectual Property Office, and entitled: "A Semiconductor Device Including Field Effect Transistors," is incorporated by reference herein in its entirety.

BACKGROUND

1. Field

Embodiments relate to a semiconductor device and, more particularly, to a semiconductor device including fin field effect transistors.

2. Description of the Related Art

A semiconductor device may include an integrated circuit having, for example, metal-oxide-semiconductor field effect transistors (MOSFETs). As size and design rules of the semiconductor device continue to become smaller, MOSFETs are increasingly being scaled down. The scale-down of the MOSFETs may cause characteristics of certain semiconductor devices to be degraded. Accordingly, various researches have been conducted to overcome the limitations resulting from high integration of the semiconductor device and to manufacture the semiconductor device with superior performance.

SUMMARY

According to example embodiments, a semiconductor device may include a fin structure on a substrate and extending in a first direction, a gate electrode crossing over the fin structure, source/drain regions on the fin structure at opposite sides of the gate electrode, and a barrier layer between the fin structure and each of the source/drain regions, wherein the fin structure includes a material having a lattice constant different from that of the substrate, wherein the fin structure, the source/drain regions, and the barrier layer include germanium, and wherein a germanium concentration in the barrier layer is greater than that in the fin structure and less than a maximum germanium concentration in each of the source/drain regions.

In example embodiments, each of the source/drain regions may include a first layer and a second layer sequentially stacked on the barrier layer and the first layer may be interposed between the barrier layer and the second layer. The germanium concentration of the barrier layer may be greater than that of the first layer and less than that of the second layer.

In example embodiments, each of the source/drain regions may further include a third layer on the second layer and the second layer is interposed between the first and third layers. The germanium concentration of the third layer may be less than that of the respective first and second layers.

In example embodiments, the semiconductor device may further include a buffer layer disposed between the substrate and the fin structure. The fin structure may include a buffer pattern protruding from the buffer layer and extending in one direction, an active pattern being provided between the buffer pattern and the gate electrode and including the germanium. The germanium concentration of the barrier layer is greater than that of the active pattern.

In example embodiments, the buffer layer may include a material having a lattice constant different from that of substrate. The buffer layer and the buffer pattern may include the same material having the same lattice constant. The buffer layer and the buffer pattern may apply a compressive stress to the active pattern.

In example embodiments, the buffer layer and the buffer pattern may include germanium. A germanium concentration of the buffer layer and the buffer pattern may be less than that of the active pattern.

In example embodiments, the semiconductor may further include device isolation layers provided on the buffer layer and disposed at both sides of the fin structure. The active pattern may have sidewalls exposed by the device isolation layers. The gate electrode may cover a top surface and the exposed sidewalls of the active pattern, and extend over top surfaces of the device isolation layers.

In example embodiments, the fin structure may include a first portion under the gate electrode and second portions at both sides of the gate electrode. Top surfaces of the second portions may be positioned at lower level than a top surface of the first portion. The source/drain regions may be disposed on the second portions, respectively.

In example embodiments, barrier layer may be interposed between each of the source/drain regions and each of the second portions, and extend between the each of the source/drain regions and the first portion.

In example embodiments, the fin structure, the source/drain regions and the barrier layer may include germanium.

In example embodiments, the source/drain regions may further include boron.

According to example embodiments, a semiconductor device may include a buffer layer on a substrate, a fin structure protruded from the buffer layer, a gate electrode crossing over the fin structure, source/drain regions provided on the fin structure at both sides of the gate electrode, and a barrier layer interposed between each of the source/drain regions and the fin structure. The buffer layer may have a lattice constant different from that of the substrate. The barrier layer may include germanium.

In example embodiments, the fin structure may include a first portion under gate electrode and second portions at both sides of the gate electrode. Top surfaces of the second portions may be positioned at lower level than a top surface of the first portion. The source/drain regions may be disposed on the second portions, respectively.

In example embodiments, the barrier layer may be interposed between each of the source/drain regions and each of the second portions, and extend between the each of the source/drain regions and the first portion.

In example embodiments, the fin structure may include a barrier pattern protruding from the buffer layer and extending in one direction parallel to an upper surface of the substrate, and an active pattern being provided between the buffer pattern and the gate electrode. The active pattern may include a material having a lattice constant different from that of buffer pattern.

In example embodiments, the buffer layer and the buffer pattern may include the same material having the same lattice constant. The buffer layer and the buffer pattern may apply a compressive stress to the active pattern.

In example embodiments, the active pattern and the source/drain regions may include germanium. A germanium concentration of the barrier layer may be greater than that of the fin structure and less than a maximum germanium concentration of each of the source/drain regions.

In example embodiments, each of the source/drain regions may include a first layer and a second layer sequentially stacked on the barrier layer and the first layer may be interposed between the barrier layer and the second layer. The germanium concentration of the barrier layer may be greater than that of the first layer and less than that of the second layer.

In example embodiments, each of the source/drain regions may further include a third layer on the second layer and the second layer is interposed between the first and third layers. The germanium concentration of the third layer may be less than that of the respective first and second layers.

In example embodiments, the buffer layer and the buffer pattern may include the same material having the same lattice constant. The buffer layer and the buffer pattern may apply a tensile stress to the active pattern.

In example embodiments, the barrier layer may include an element different from an element that composes the source/drain regions and the active pattern.

In example embodiments, the active pattern and the source/drain regions may include silicon.

According to example embodiments, a semiconductor device may include a buffer layer on a substrate, a fin structure protruding from the buffer layer, the fin structure including an active pattern, a gate electrode crossing over the fin structure, the active pattern of the fin structure being between the buffer layer and the gate electrode, source/drain regions on the fin structure at opposite sides of the gate electrode, and a barrier layer between each of the source/drain regions and the fin structure, the barrier layer including overlapping sidewalls of the active pattern.

In example embodiments, the barrier layer may extend continuously along a bottom of each of the source/drain regions and along an entirety of sidewalls of the active pattern.

In example embodiments, the barrier layer and the active pattern may include germanium, a germanium concentration in the barrier layer being greater than that of the active pattern.

In example embodiments, the fin structure may include a first portion under the gate electrode, the active pattern being in the first portion, and second portions at opposite sides of the first portion, top surfaces of the second portions being at a lower level than a top surface of the first portion, and the barrier layer extending continuously on the top surfaces of the second portions and along sidewalls of the first portion toward the top surface of the first portion.

In example embodiments, the barrier layer may separate each of the source/drain region from adjacent first and second portions of the fin structure.

In example embodiments, the barrier layer may extend along a profile of the fin structure to contact a bottom of the gate electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
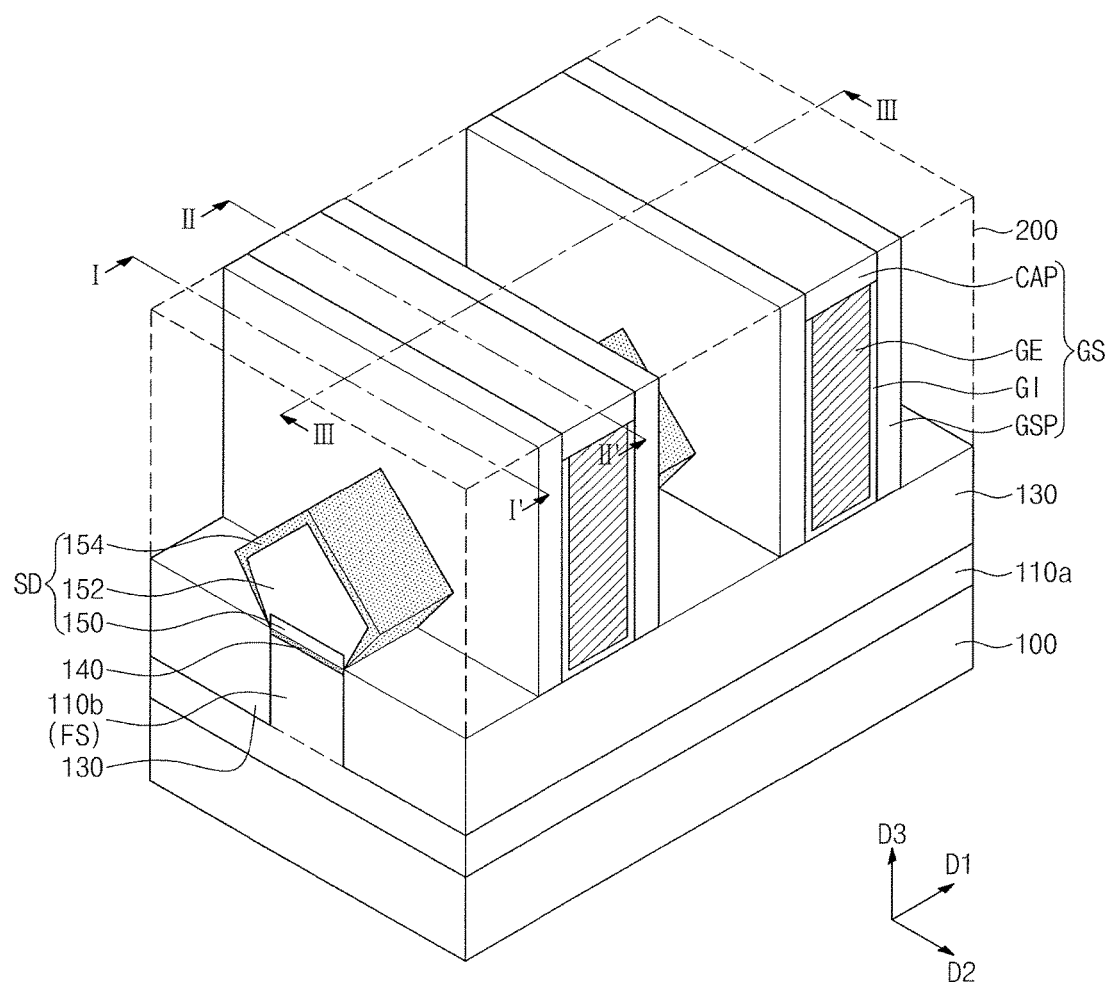
FIG. 1 illustrates a perspective view of a semiconductor device according to example embodiments.

Embodiments will be described more fully hereinafter with reference to the accompanying drawings. The embodiments may, however, be embodied in many different forms and should not be construed as limited to those set forth herein. Rather, these embodiments are provided so that this disclosure will be thorough and complete, and will fully convey the scope of the exemplary implementations to those skilled in the art.

It should be noted that the accompanying drawings are intended to illustrate the general characteristics of methods, structure, and/or materials utilized in certain example embodiments and to supplement the written description provided below. In the drawings, the sizes and relative sizes of layers and regions may be exaggerated for clarity. Like numbers refer to like elements throughout, and use of similar or identical reference numbers is intended to indicate the presence of a similar or identical element or feature.

It will also be understood that when an element such as a layer, a region, or a substrate is referred to as being "on" or "onto" another element, it may be directly on the other element or intervening elements or layers may also be present. In addition, it will also be understood that when an element is referred to as being "between" two elements, it can be the only element between the two elements, or one or more intervening elements may also be present.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 2:
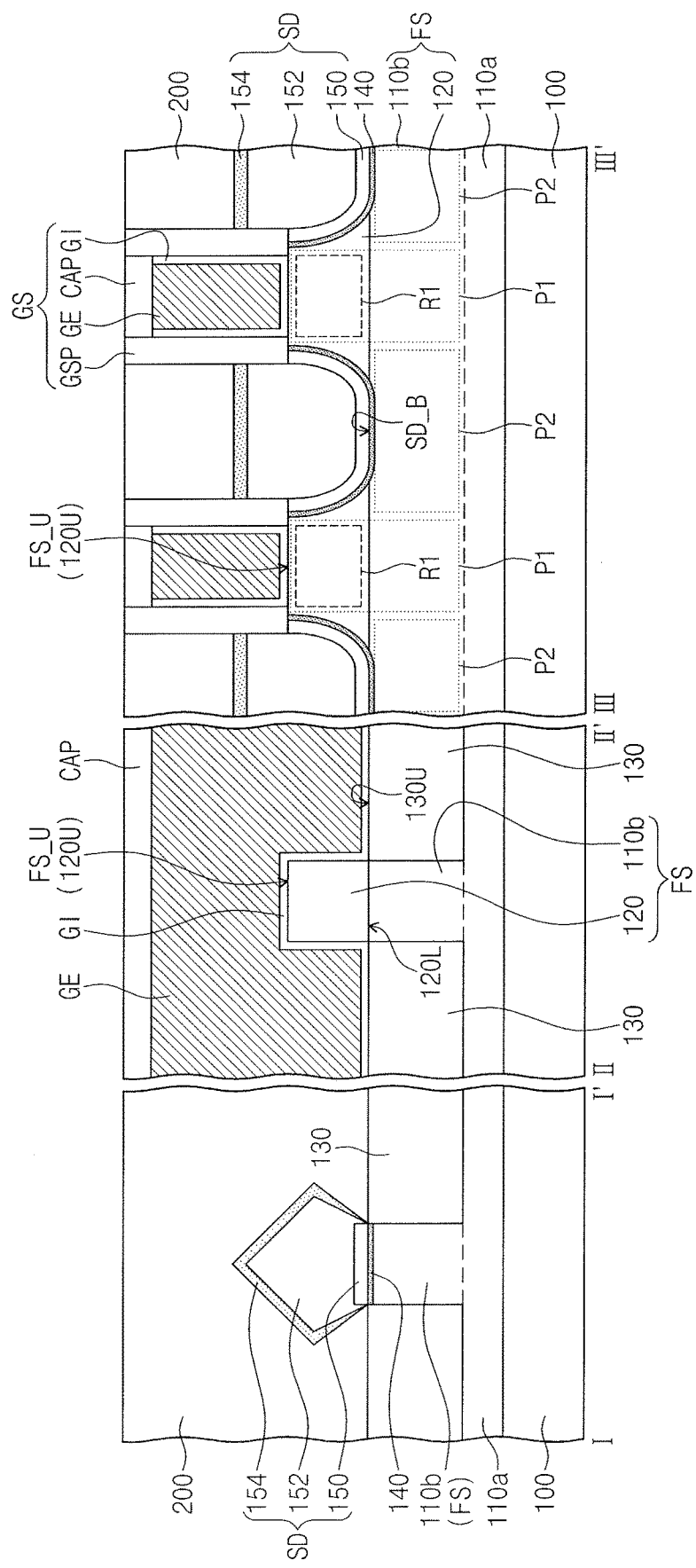
FIG. 2 illustrates a cross-sectional view taken along lines I-I', II-II', and III-III' of FIG. 1.

FIG. 1 is a perspective view illustrating a semiconductor device according to example embodiments. FIG. 2 is a cross-sectional view along the lines I-I', II-II', and III-III' of FIG. 1.

Referring to FIG. 1 and FIG. 2, a buffer layer 110a may be provided on a substrate 100. The substrate 100 may be a semiconductor substrate. As an example, the substrate 100 may include a silicon substrate or a SOI (silicon on insulator) substrate. The buffer layer 110a may include a material having a lattice constant different from that of the substrate 100. The lattice constant of the buffer layer 110a may be greater than that of the substrate 100. As an example, in the case that the substrate 100 is a silicon substrate, the buffer layer 110a may include a silicon-germanium layer on the substrate 100.

A fin structure FS may be provided on the buffer layer 110a in a first direction D1. The fin structure FS may protrude from the buffer layer 110a along a third direction D3 perpendicular to each of the first and second directions D1 and D2 that cross each other. The first and second direction D1 and D2 may be parallel to a top surface of the substrate 100.

The fin structure FS may include a buffer pattern 110b protruding from the buffer layer 110a in the third direction D3 and an active pattern 120 disposed on the buffer pattern 110b. The buffer pattern 110b may be provided between the buffer layer 110a and the active pattern 120. The buffer pattern 110b may extend in the first direction D1, and the active pattern 120 may be provided on a top surface of the buffer pattern 110b.

The buffer pattern 110b may include the same material as the buffer layer 110a, and a lattice constant of the buffer pattern 110b may be the same as that of the buffer layer 110a. The buffer pattern 110b and buffer layer 110a may be portions of a single layer connected to each other, e.g., the buffer pattern 110b and buffer layer 110a may be portions of a same layer.

The active pattern 120 may include a material having a lattice constant different from that of the buffer pattern 110b. According to example embodiments, the lattice constant of the active pattern 120 may be greater than that of the buffer pattern 110b. Accordingly, the buffer pattern 110b may apply compressive stress to the active pattern 120. As an example, the active pattern 120 and the buffer pattern 110b may include silicon-germanium (SiGe). A germanium concentration in the active pattern 120 may be greater than a germanium concentration in the buffer pattern 110b. As an example, the buffer pattern 110b may include silicon-germanium (SiGe) with a germanium concentration of about 20 at % (atomic percent), and the active pattern 120 may include silicon-germanium (SiGe) with a germanium concentration of about 40 at % (atomic percent).

Device isolation layers 130 may be provided at both sides of the fin structure FS. The device isolation layers 130 may include, e.g., oxide, nitride, and/or oxynitride. The device isolation layers 130 may be provided on the buffer layer 110a and may extend in the first direction D1. The device isolation layers 130 may be spaced apart from each other along the second direction D2 with the fin structure FS interposed therebetween.

The device isolation layer 130 may expose an upper portion of the fin structure FS. Each of the device isolation layer 130 may expose a portion of a sidewall of the fin structure FS. That is, the fin structure FS may have sidewalls exposed by the device isolation layers 130. Each of top surfaces 130U of the device isolation layer 130 may be positioned at a lower level than a top surface FS_U of the fin structure FS, i.e., relative to the substrate 100.

At least a portion of the active pattern 120 may be exposed by the device isolation layer 130. Each of the device isolation layer 130 may expose at least a portion of the sidewall of the active pattern 120. That is, the active pattern 120 may have sidewalls exposed by the device isolation layer 130. Each of the top surfaces 130U of the device isolation layers 130 may be positioned at a lower level than a top surface of the active pattern 120. In some example embodiments, as shown in the FIG. 2, each of the top surfaces 130U of the device isolation layers 130 may be substantially coplanar with a bottom surface 120L of the active pattern 120. In other example embodiments, each of the top surfaces 130U of the device isolation layer 130 may be positioned at a lower or higher level than the bottom surface 120L of the active pattern 120.

A gate structure GS may be provided on the substrate 100. The gate structure GS may extend in the second direction D2 to cross over the fin structure FS. The active pattern 120 may be provided between the buffer pattern 110b and the gate structure GS. In some example embodiments, the active pattern 120 may be locally provided under the gate structure GS.

The fin structure FS may include a first portion P1 under the gate structure GS and second portions P2 at both sides of the gate structure GS. A top surface of the first portion P1 may be positioned at a higher level than that of the second portion P2. That is, the top surface FS_U of the fin structure FS may be the top surface of the first portion P1. The first portion P1 of the fin structure FS may have sidewalls exposed by the device isolation layer 130. The gate structure GS may cover the top surface of the first portion P1 and the exposed sidewalls and extend over the top surfaces 130U of the device isolation layers 130.

The first portion P1 of the fin structure FS may include the active pattern 120. The active pattern 120 may have sidewalls exposed by the device isolation layer 130. The gate structure GS may cover the top surface 120U of the active pattern 120 and the exposed sidewalls and extend over the top surfaces 130U of the device isolation layers 130.

The active pattern 120 may serve as a channel region of a transistor including the gate structure GS. In this case, the transistor may be a P-type transistor.

The gate structure GS may include a gate electrode GE extending in the second direction D2, a gate insulating pattern GI which is interposed between the gate electrode GE and the fin structure FS and extends between each of the device isolation layers 130 and the gate electrode GE, and a capping pattern CAP extending along a top surface of the gate electrode GE. The gate structure GS may further include gate spacers GSP provided on opposite sidewalls of the gate electrode GE. The gate insulating pattern GI may extend between the gate electrode GE and the gate spacers GSP.

The gate electrode GE may include at least one of conductive metal nitride (e.g., titanium nitride, tantalum nitride) and metal (e.g., aluminum, tungsten). The gate insulating pattern GI may include at least one of high-k dielectric layers. For example, insulating pattern GI may include at least one of hafnium oxide, hafnium silicate, zirconium oxide or zirconium silicate. The capping pattern CAP and the gate spacers GSP may include nitride (e.g., silicon nitride).

Source/drain regions SD may be provided on the fin structure FS at both sides of the gate structure GS. The source/drain regions SD may be disposed on the second portions P2 of the fin structure FS, respectively. The source/drain regions SD may be horizontally spaced apart from each other with the active pattern 120 interposed therebetween. Each of bottom surfaces SD_B of the source/drain regions SD may be positioned at a lower level than the top surface 120U of the active pattern 120.

The source/drain regions SD may include a material having a lattice constant different from that of the active pattern 120. According to an example embodiment, the lattice constant of the source/drain regions SD may be greater than that of the active pattern 120. Accordingly, the source/drain regions SD may provide compressive stress for the active pattern 120. As an example, the source/drain regions SD and the active pattern 120 may include silicon-germanium (SiGe), and a germanium concentration of each of the source/drain regions SD may be greater than that of the active pattern 120.

Each of the source/drain regions SD may include a first layer 150 and a second layer 152 sequentially stacked on the fin structure FS. The first layer 150 may be interposed between the fin structure FS and the second layer 152. The first layer 150 may be an epitaxial layer that is grown using a top surface of the second portion P2 and a sidewall of the first portion P1 of the fin structure FS as a seed. The second layer 152 may be an epitaxial layer that is grown using the first layer 150 as a seed. The first layer 150 may conformally cover the top surfaces of the second layers P2 and the sidewalls of the first layer P1. As an example, in the case that the source/drain regions SD include silicon-germanium (SiGe), a germanium concentration of the second layer 152 may be greater than that of the first layer 150. In addition, in the case that the active pattern 120 includes silicon-germanium (SiGe), the germanium concentration of the first layer 150 may be greater than that of the active pattern 120, and less than that of the second layer 152. Each of the source/drain regions SD may further include a cap layer 154 provided on the second layer 152. The cap layer 154 may cover the first and second layers 150 and 152. The cap layer 154 may be grown epitaxially using the second layer 152 as a seed. The cap layer 154 may include silicon. As an example, the cap layer 154 may be a silicon layer, or a silicon-germanium layer having a germanium concentration less than that of each of the first and second layers 150 and 152.

Each of the source/drain regions SD may further include an impurity. The impurity may be used to improve the electrical characteristics of a transistor including the source/drain regions SD. In the case that the transistor is a P-type transistor, the impurity may be, e.g., boron. A concentration of the impurity in the source/drain regions SD may be, e.g., greater than or equal to $1*10^{18}/cm^3$ and less than or equal to $1*10^{22}/cm^3$.

A barrier layer 140 may be interposed between each of the source/drain regions SD and the fin structure FS. The barrier layer 140 may be interposed between each of the source/drain regions SD and each of the second portions P2 of the fin structure FS, and may extend between each of the source/drain regions SD and the first portion P1 of the fin structure FS. For example, as illustrated in FIG. 2, the barrier layer 140 may cover the entirety of the upper surface of the buffer pattern 110b in the second portion P2 of the fin structure FS, and may continuously extend from the second portion P2 of the fin structure FS along a sidewall of the first portion P1 of the fin structure FS toward the upper surface of the first portion P1 of the fin structure FS. For example, as illustrated in FIG. 2, the barrier layer 140 may have a U-shaped structure between two gate structures GS when viewed in a cross-section, e.g., the active pattern 120 under the gate structure GS may be positioned between two U-shaped barrier layers 140. For example, as illustrated in FIG. 2, the barrier layer 140 may extend along a sidewall of the first portion P1 of the fin structure FS to contact the gate spacers GSP, such that the barrier layer 140 may overlap the entirety of a sidewall of the active pattern 120 under the gate structure GS. A pair of barrier layers 140 may be provided at both, e.g., opposite, sides of the gate structure GS, respectively. That is, the pair of barrier layers 140 may be provided on the second portions P2 of the fin structure FS, respectively. The pair of barrier layers 140 may be horizontally spaced apart from each other with the active pattern 120 interposed therebetween.

The barrier layer 140 may include germanium. The active pattern 120 and the source/drain regions SD may include germanium. A germanium concentration of the barrier layer 140 may be greater than that of the active pattern 120, and less than a maximum germanium concentration of each of the source/drain regions SD.

In the case that each of the source/drain regions SD includes the first and second layers 150 and 152, the barrier layer 140 may be interposed between the first layer 150 and the fin structure FS. The barrier layer 140 may be interposed between the first layer 150 and the top surface of each of the second portions P2, and may extend between the first layer 150 and the first portion P1. In the case that the first and second layers 150 and 152 of the source/drain regions SD include germanium, the germanium concentration of the barrier layer 140 may be greater than that of the first layer 150 and less than that of the second layer 152.

As an example, the active pattern 120, the barrier layer 140, and the source/drain regions SD may include silicon-germanium (SiGe), and the first and second layers 150 and 152 of the source/drain regions SD may include silicon-germanium (SiGe) having a germanium concentration different from each other. The germanium concentration of the second layer 152 may be greater than that of the first layer 150. In this case, as described previously, the germanium concentration of the barrier layer 140 may be greater than that of the active pattern 120 and less than the maximum germanium concentration of each of the source/drain regions SD, e.g., less that the germanium concentration of the second layer 152 in each of the source/drain regions SD. For example, the germanium concentration of the barrier layer 140 may be greater than that of the first layer 150 and less than that of the second layer 152.

A thickness of the barrier layer 140 may be equal to or less than 3 nanometers.

Generally, in order to improve electrical characteristics of transistors with source/drain regions, impurities may be doped in the source/drain regions. However, the impurities may diffuse from the source/drain regions into the active pattern. As the active pattern may serve as a channel region of the transistor, the electrical characteristics of the transistor may be degraded due to the diffused impurities in the active pattern.

In contrast, according to example embodiments, the barrier layer 140 may be interposed between the source/drain regions SD and the active pattern 120, and may include a high concentration of germanium. For example, as the barrier layer 140 continuously extends from the second portion P2 of the fin structure FS along a sidewall of the first portion P1 to overlap the entirety of the sidewall of the active pattern 120 under the gate structure GS, a pair of barrier layers 140 at opposite sides of the gate structure GS, i.e., at opposite sides of the active pattern 120, may improve diffusion prevention of impurities from the source/drain regions SD into the active pattern 120. The barrier layer 140 with the high concentration of germanium may further suppress diffusion of impurities from the source/drain regions SD into the active pattern 120. Accordingly, the electrical characteristics of the transistor with the source/drain regions SD may be improved.

A lower interlayer insulating layer 200 may be provided on the substrate 100 to cover the gate structure GS and the source/drain regions SD. The lower interlayer insulating layer 200 may include at least one of, e.g., a silicon oxide layer, a silicon nitride layer, a silicon oxynitride layer, or a low-k dielectric layer. The gate structure GS may extend in the second direction D2 to partially cover the top surface 130U of each of the device isolation layers 130. The lower interlayer insulating layer 200 may contact a portion of the top surface 130U of the device isolation layer 130 not covered by the gate structure GS.

Although not shown in the drawings, an upper interlayer insulating layer may be disposed on the substrate 100 including the gate structure GS. The upper interlayer insulating layer may include, e.g., oxide, nitride, and/or oxynitride. First contact plugs penetrating the upper and lower interlayer insulating layers may be provided to be electrically connected to the source/drain regions SD. A second contact plug penetrating the upper and lower interlayer insulating layers may be provided to be electrically connected to the gate electrode GE. Wiring lines may be disposed on the upper interlayer insulating layer to be connected to the first and second contact plugs. The wiring lines may apply voltage to the source/drain regions SD and the gate electrode GE through the first and second contact plugs. The first and second contact plugs and the wiring lines may include conductive materials.

FIGS. 3, 5, 7, 9, and 11 are perspective views illustrating stages in a method of manufacturing a semiconductor device according to example embodiments. FIGS. 4, 6, 8, 10 and 12 are cross-sectional views taken along lines I-I', II-II' and III-III' of FIGS. 3, 5, 7, 9 and 11, respectively.

Figure 3:
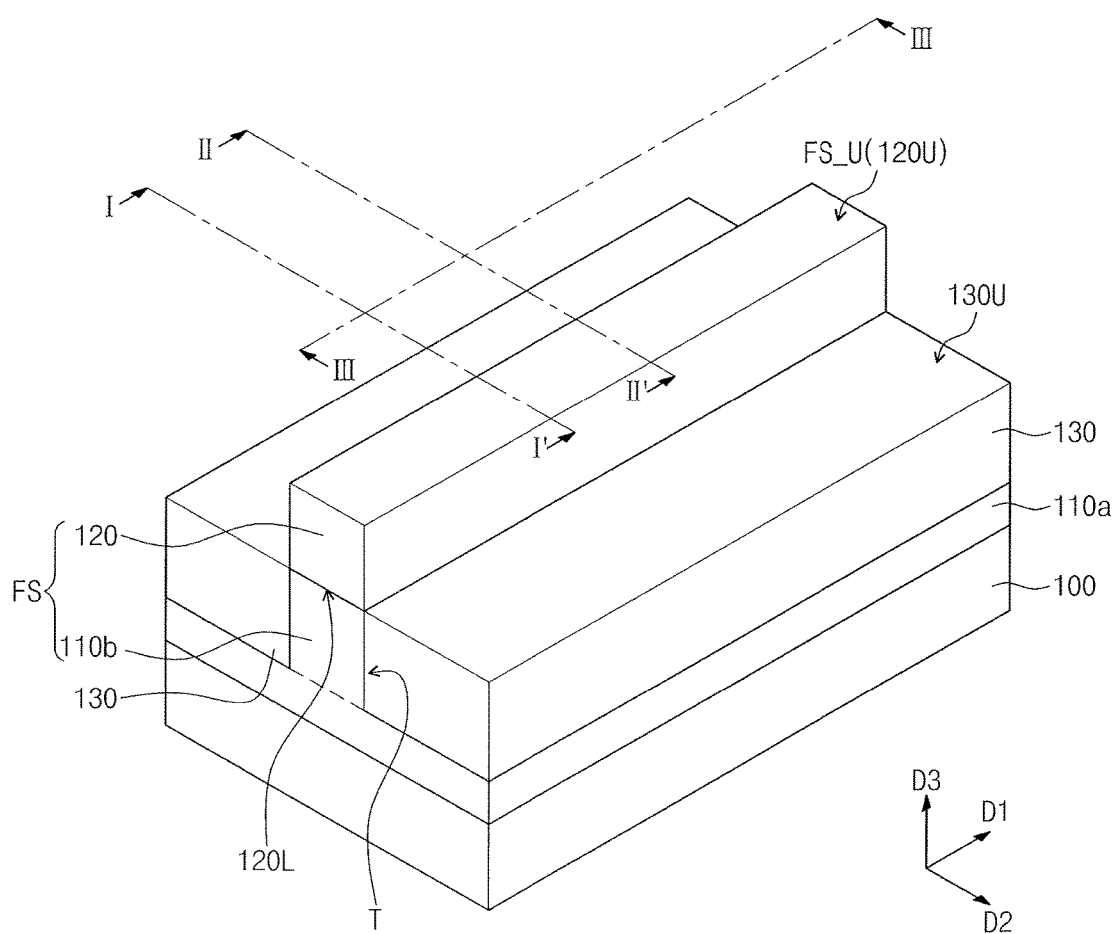
FIGS. 3, 5, 7, 9, and 11 illustrate perspective views of stages in a method of manufacturing a semiconductor device according to example embodiments.
Figure 4:
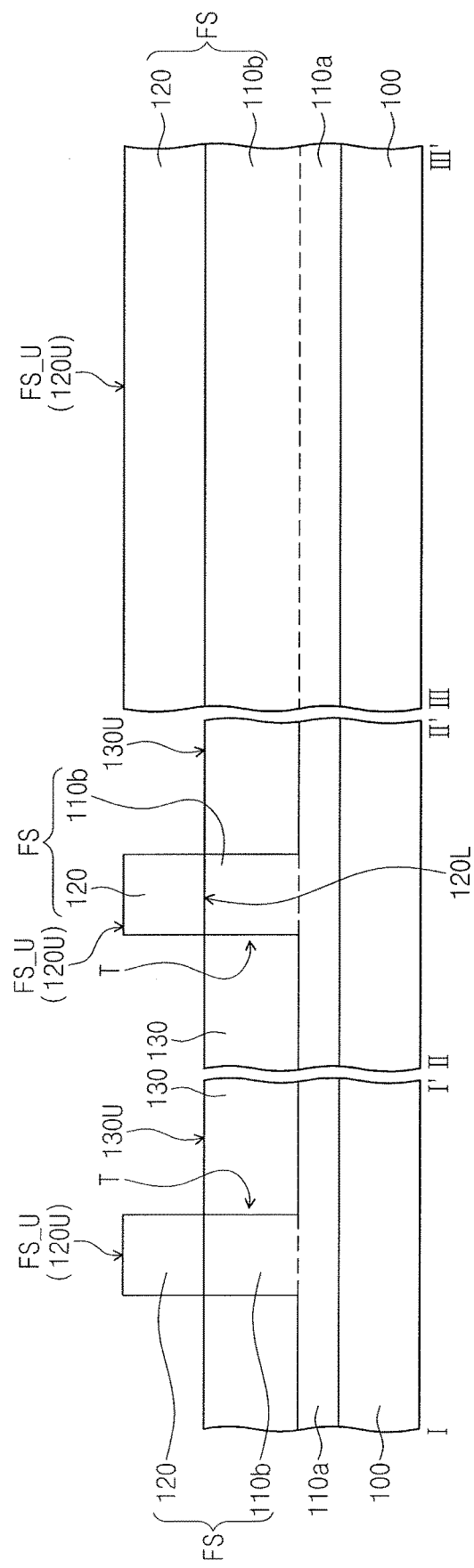
FIGS. 4, 6, 8, 10 and 12 illustrate cross-sectional views taken along lines I-I', II-II', and III-III' of FIGS. 3, 5, 7, 9 and 11, respectively.

Referring to FIGS. 3 and 4, the buffer layer 110a may be formed on the substrate 100. The fin structure FS may be formed on the buffer layer 110a and may extend in the first direction D1. The fin structure FS may include the buffer pattern 110b protruding from the buffer layer 110a and extending in the first direction D1, and the active pattern 120 provided on the top surface of the buffer pattern 110b and extending in the first direction D1. Forming the fin structure FS may include sequentially forming a preliminary buffer layer and an active layer on the substrate 100, and forming trenches T in the preliminary buffer layer and the active layer to define the fin structure FS by patterning the preliminary buffer layer and the active layer. The trenches T may have a line shape extending the first direction D1.

In detail, the preliminary buffer layer may include a material having a lattice constant different from that of the substrate 100. A lattice constant of the preliminary buffer layer may be greater than that of the substrate 100. In the case that the substrate 100 is a silicon substrate, the preliminary buffer layer may include silicon-germanium. As an example, the preliminary buffer layer may be formed by performing a selective epitaxial growth process using the substrate 100 as a seed. As another example, the preliminary buffer layer may be formed using a chemical vapor deposition (CVD) or molecular beam epitaxy (MBE) processes.

The active layer may be formed on the preliminary buffer layer and may include a material having a lattice constant different from that of the preliminary buffer layer. According to an example embodiment, a lattice constant of the active layer may be greater than that of the preliminary buffer layer. As an example, the active layer and the preliminary buffer layer may include silicon-germanium, and the germanium concentration of the active layer may be greater than that of the preliminary buffer layer. Accordingly, the preliminary buffer layer may provide compressive stress for the active layer. As an example, the active layer may be formed by performing a selective epitaxial growth process using the preliminary buffer layer as a seed. As other example, the active layer may be formed using a chemical vapor deposition (CVD) or molecular beam epitaxy (MBE) processes.

Forming the trenches T may include forming a mask pattern defining the fin structure FS and anisotropically etching the active layer and the preliminary buffer layer using the mask pattern as an etch mask. During the etching process, the active pattern 120 and the buffer pattern 110b may be formed by etching the active layer and an upper portion of the preliminary buffer layer, respectively. A lower portion of the preliminary buffer layer that is not etched during the etching process may remain to define the buffer layer 110a.

Device isolation layers 130 may be formed on the buffer layer 110a at both sides of the fin structure FS. The device isolation layers 130 may be formed to fill the trenches T. Forming the device isolation layer 130 may include forming an insulating layer that fills the trenches T on the substrate 100, and planarizing the insulating layer until the mask pattern is exposed. An upper portion of the fin structure FS may be exposed by recessing an upper portion of the device isolation layers 130. Accordingly, the top surfaces 130U of the device isolation layers 130 may be positioned at a lower level than the top surface FS_U of the fin structure FS. At least a portion of the active pattern 120 may be exposed after performing the recess process of the device isolation layers 130. Accordingly, the top surfaces 130U of the device isolation layers 130 may be positioned at a lower level than the top surface of the active pattern 120. According to an example embodiment, as shown in the FIG. 4, the top surfaces 130U of the device isolation layers 130 may be substantially coplanar with a bottom surface 120L of the active pattern 120. In other example embodiments, unlike that shown in FIG. 4, the top surfaces 130U of the device isolation layers 130 may be positioned at a higher or lower level than the bottom surface 120L of the active pattern 120. Recessing the upper portion of the device isolation 130 may be performed using a wet etching process having an etch selectivity with respect to the fin structure FS. The mask pattern may be removed during recessing the upper portion of the device isolation layer 130.

Figure 5:
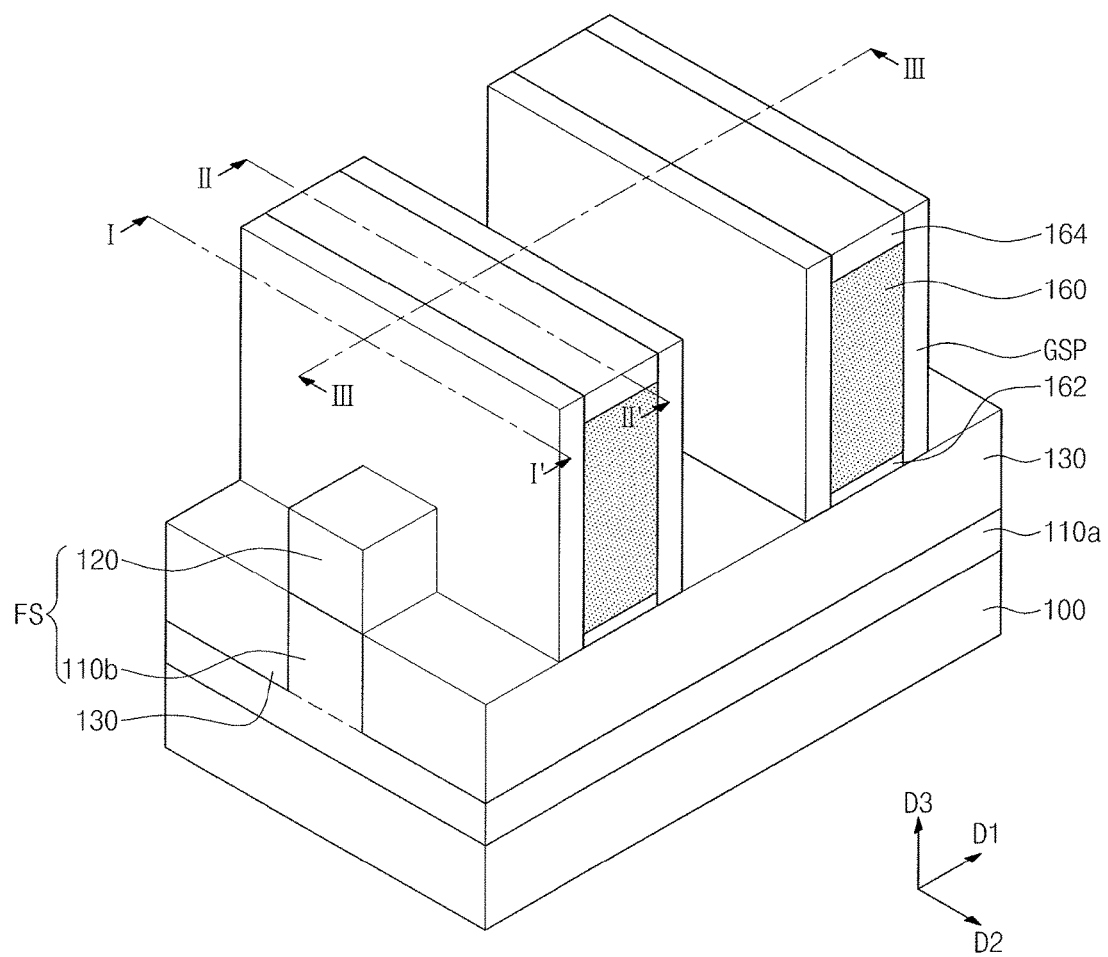
Figure 6:
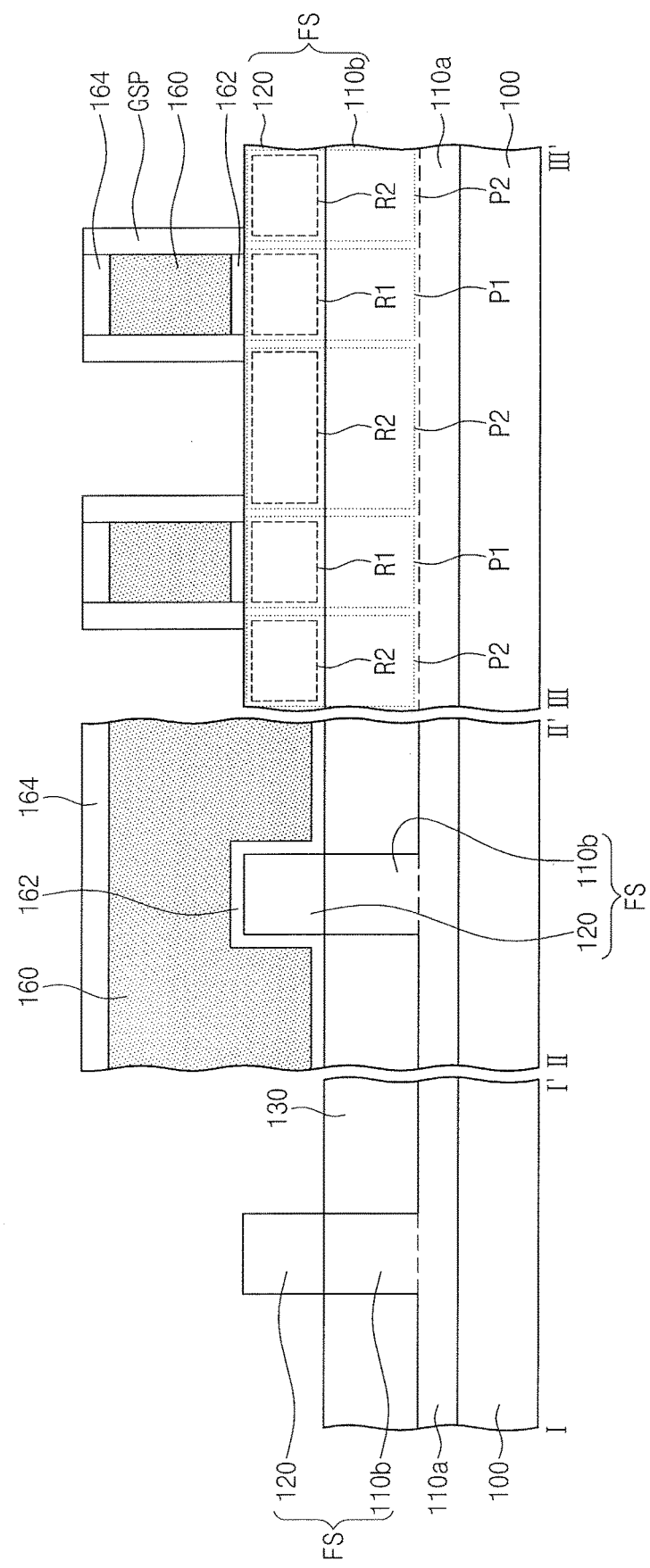

Referring to FIGS. 5 and 6, an etch stop layer and a sacrificial gate layer may be sequentially formed on the substrate 100 to cover the fin structure FS and the device isolation layer 130. The etch stop layer may include, e.g., a silicon oxide layer. The sacrificial gate layer may include a material having an etch selectivity with respect to the etch stop layer. The sacrificial gate layer may include, e.g., a polycrystalline silicon layer.

A sacrificial gate pattern 160 may be formed by patterning the sacrificial gate layer. Forming the sacrificial gate pattern 160 may include forming a gate mask pattern 164 on the sacrificial gate layer, and etching the sacrificial gate layer using the gate mask pattern 164 as an etch mask. The gate mask pattern 164 may include, e.g., silicon nitride. Etching the sacrificial gate layer may include performing the etching process having an etch selectivity with respect to the etch stop layer.

After forming the sacrificial gate pattern 160, the etch stop layer at both sides of the sacrificial gate pattern 160 may be removed to form a etch stop pattern 162 under the sacrificial gate pattern 160. The etch stop pattern 162 may extend along a bottom surface of the sacrificial gate pattern 160 to cover a top surface and sidewalls of the fin structure FS and top surfaces of the device isolation layers 130.

As the sacrificial gate pattern 160 may be formed to cross over the fin structure FS, the first portion P1 and the second portion P2 may be defined in the fin structure FS. The first portion P1 may be located under the sacrificial gate pattern 160 and may be a portion of the fin structure that overlaps the sacrificial gate pattern when viewed from a plan view. The second portions P2 may be located at both sides of the sacrificial gate pattern 160 and may be portion of the fin structure FS horizontally separated by the first portion P1.

In addition, as the sacrificial gate pattern 160 may be formed to cross over the fin structure FS, a first region R1 and a second region R2 may be defined in the active pattern 120. The first region R1 may be located under the sacrificial gate pattern 160 and may be a region of the active pattern 120 that overlaps with the sacrificial gate pattern 160. The second regions R2 may be located at both sides of the sacrificial gate pattern 160 and may be regions of the active pattern 120 horizontally separated by the active pattern 120. The first region R1 of the active pattern 120 may be an upper portion of the first portion P1 of the fin structure FS, and each of the second regions R2 of the active pattern 120 may be an upper portion of each of the second portions P2.

The gate spacers GSP may be formed on opposite sidewalls of the sacrificial gate pattern 160. The gate spacers GSP may include, e.g., silicon nitride. Forming the gate spacers GSP may include forming a gate spacer layer on the substrate formed with the sacrificial gate pattern 160 and anisotropically etching the gate spacer layer. As a result, top surfaces of the second portions of the fin structure FS and top surfaces of the device isolation layers 130 at both sides of the sacrificial gate pattern 160 may be exposed. Furthermore, sidewalls of the second portions P2 of the fin structure FS may be exposed during the etching process. A portion of the gate mask pattern 164 may be removed during the etching process, and the rest of the gate mask pattern 164 may remain on the sacrificial gate pattern 160 after the etching process.

Figure 7:
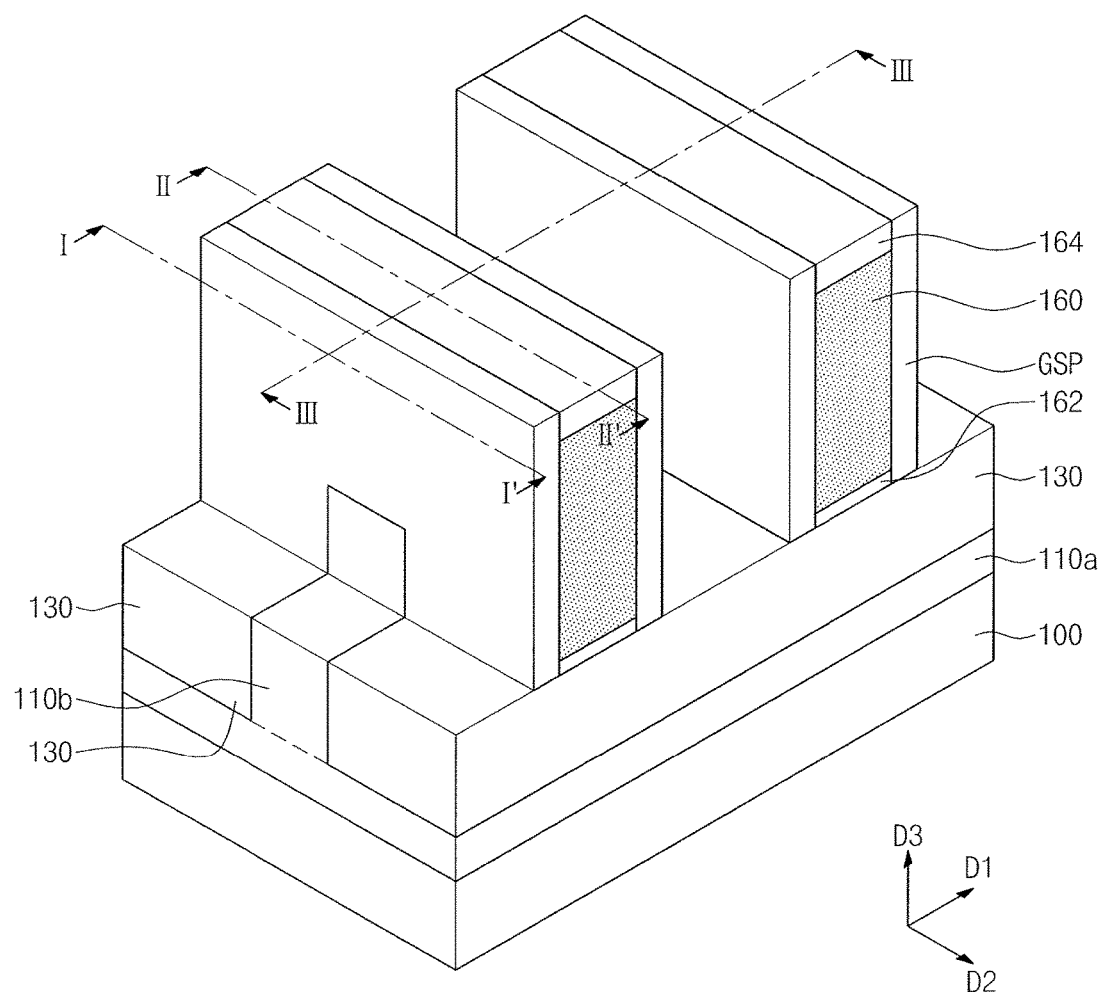
Figure 8:
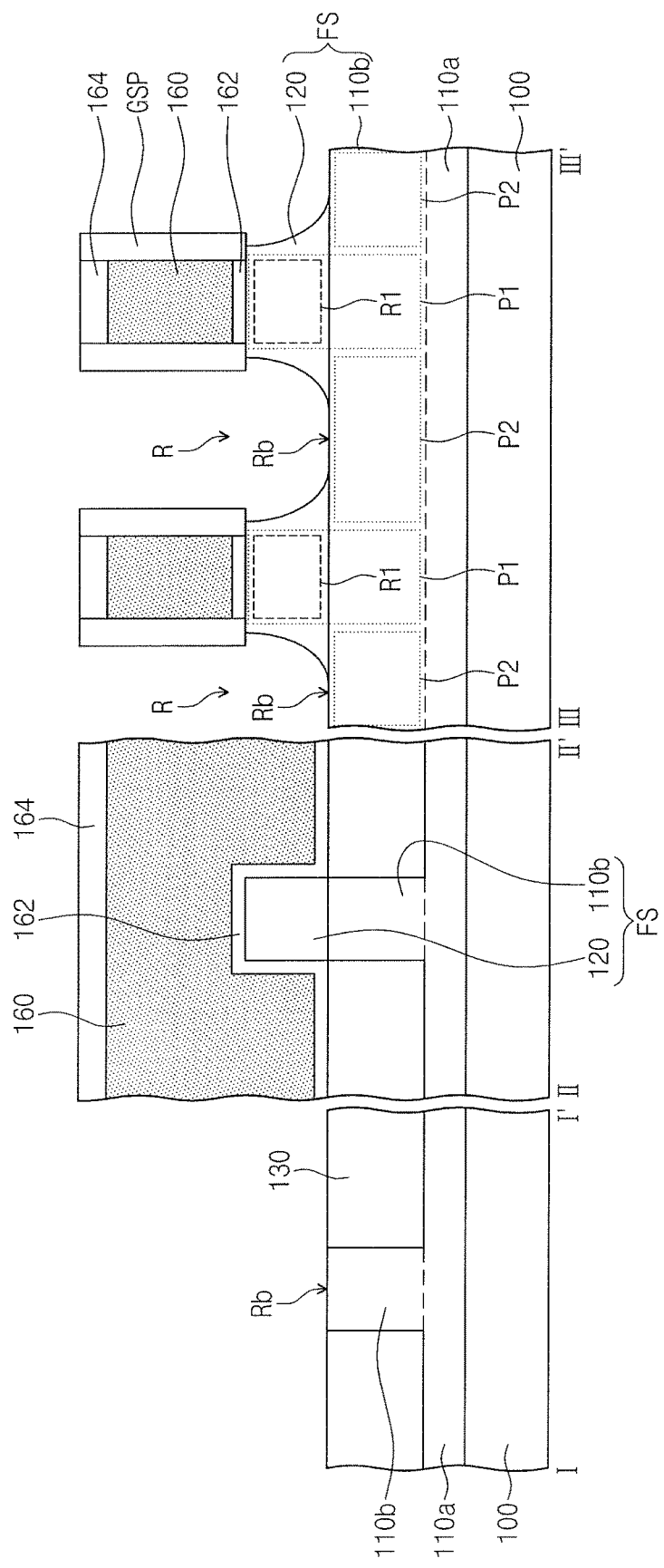

Referring to FIGS. 7 and 8, an upper portion of the second portion P2 of the fin structure FS may be removed to form a recess region R in the fin structure FS. For example, the upper portion of the second portion P2 protruding above the device isolation layers 130 in the second region R2, i.e., in a region not overlapping the sacrificial gate pattern 160, may be removed, such that a remaining portion of the second portion P2 has a top surface that is at least partially level with the upper surface 130U of the device isolation layers 130. Accordingly, the top surface of the remaining second portion P2 may be positioned at lower level than that of the first portion P1. The removal of the upper portion of the second portion P2 may be performed using a dry or wet etching process. At least a portion of the second region R2 of the active pattern 120 may be removed by the etching process.

According to an example embodiment, as shown in the FIG. 8, the recess region R may be formed to expose a top surface of the buffer pattern 110b. That is, a bottom surface Rb of the recess region R may be in contact with the top surface of the buffer pattern 110b. According to other example embodiments, unlike FIG. 8, the recess region R may be formed not to expose the top surface of the buffer pattern 110b. That is, a portion of the active pattern 120 may be interposed between the bottom surface Rb of the recess region R and the top surface of the buffer pattern 110b.

According to some example embodiments, the recess region R may extend under the gate spacers GSP. That is, when viewed in a plan view, the recess region R may partially overlap the gate spacers GSP. As shown in the FIG. 8, when viewed in a cross-sectional view, the recess region R may be formed to have a U-shape.

Figure 9:
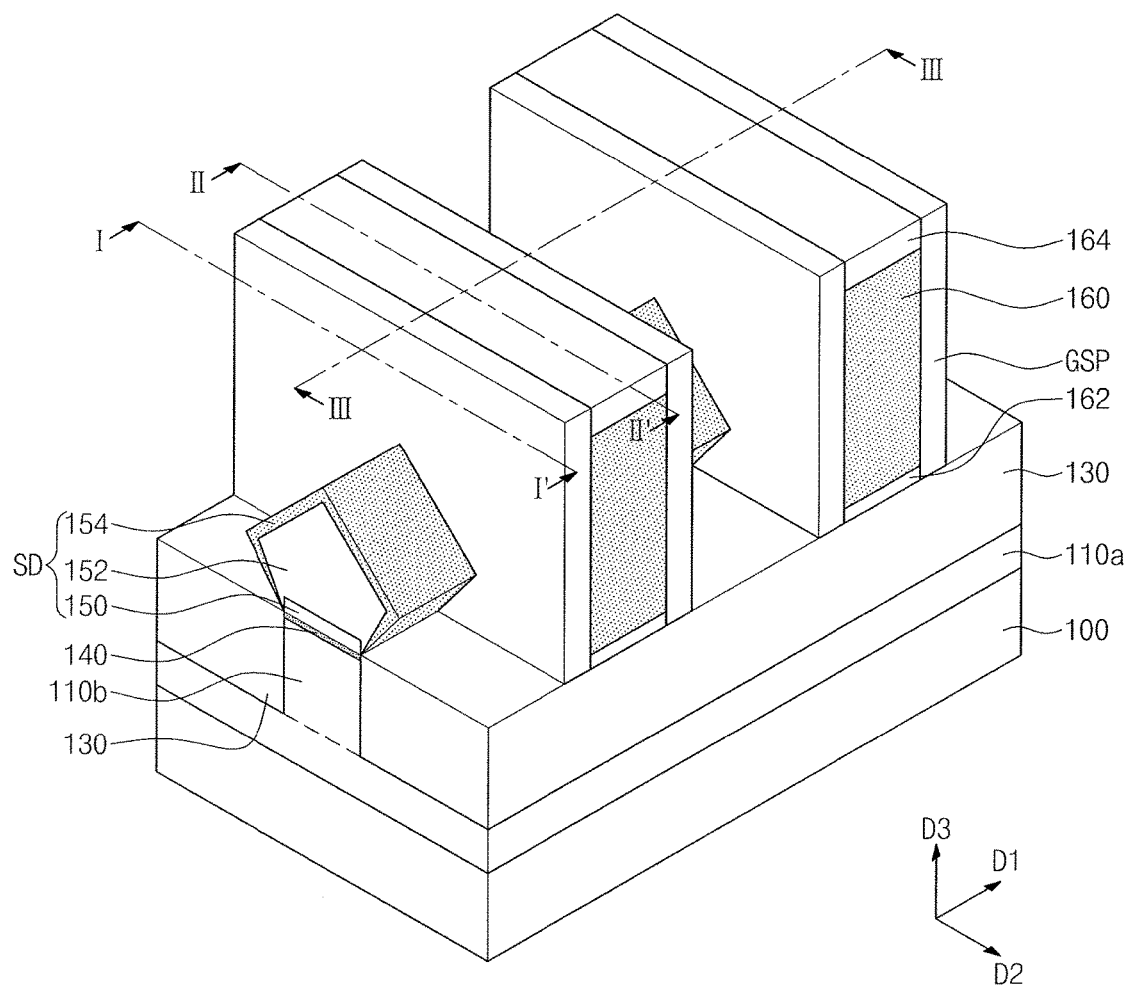
Figure 10:
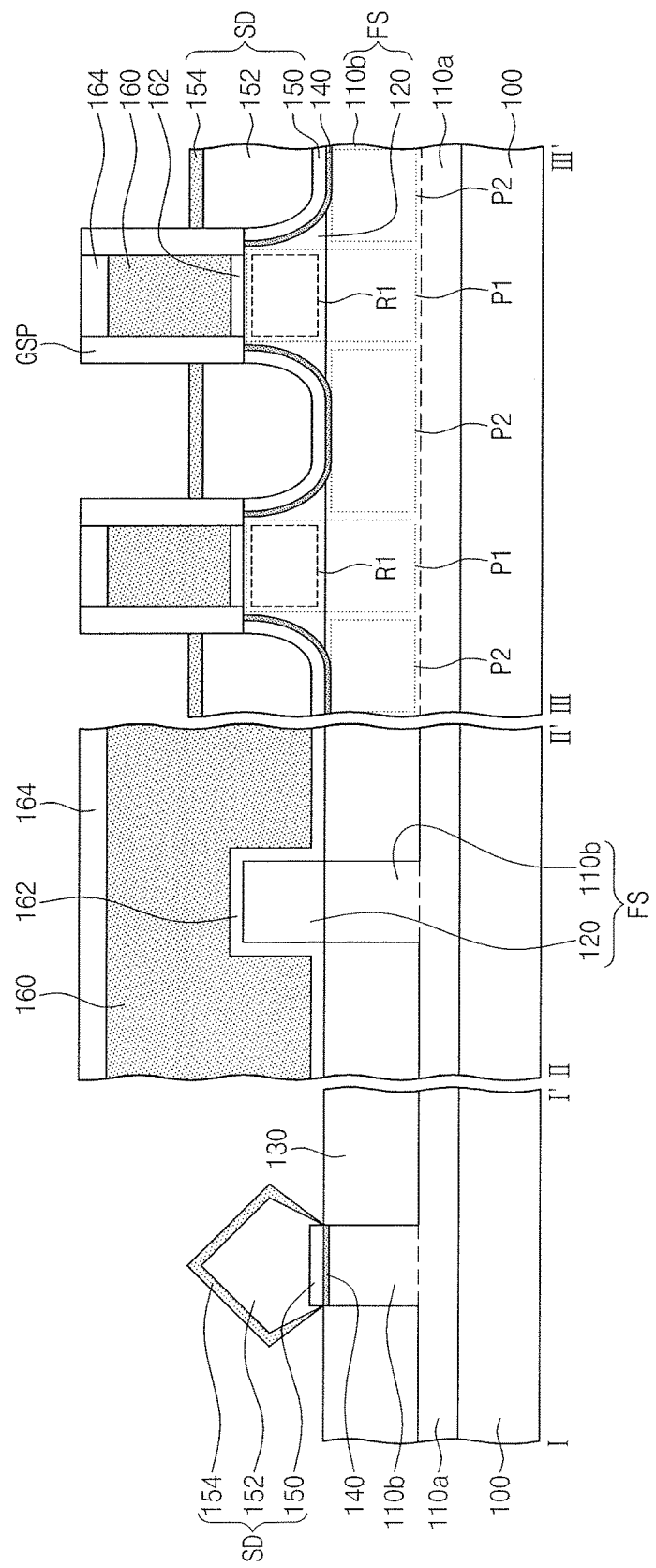

Referring to FIGS. 9 and 10, source/drain regions SD may be formed at both sides of the sacrificial gate pattern 160. The source/drain regions SD may be formed on the remaining second portions P2 of the fin structure FS, respectively. Each of the source/drain regions SD may be formed to fill the recess region R. More specifically, the first layer 150 may be formed to fill a portion of the recess region R. the first layer 150 may conformally cover an inner surface of the recess region R. The formation of the first layer 150 may include performing a selective epitaxial growth process using a surface of the fin structure FS exposed by the recess region R as a seed. Next, the second layer 152 may be formed to fill the rest of the recess region R. The formation of the second layer 152 may include performing the selective epitaxial growth process using the first layer 150 as a seed. The cap layer 154 may be formed on the second layer 152. The cap layer may be formed to cover the first and second layers 150 and 152. The formation of the cap layer 154 may include performing the selective epitaxial growth process using the second layer 152 as a seed.

According to an example embodiment, the active pattern 120, and the first and second layers 150 and 152 may include germanium. For example, the active pattern 120, and the first and second layers 150 and 152 may include silicon-germanium (SiGe). The germanium concentration of the first layer 150 may be greater than that of the active pattern 120 and less than that of the second layer 152. The cap layer 154 may include, e.g., a silicon layer or a silicon-germanium layer having a germanium concentration less than that of each of the first and second layers 150 and 152.

The formation of the source/drain regions SD may further include doping an impurity in the source/drain regions SD while or after performing the selective epitaxial growth process. The impurity may include, e.g., boron (B).

The barrier layer 140 may be formed between the each of the source/drain regions SD and the fin structure FS. More specifically, the barrier layer 140 may be interposed between the source/drain regions SD and the second portions P2 of the fin structure FS, and may be extended between the source/drain regions SD and the first portion P1 of the fin structure FS. According to an example embodiment, the barrier layer 140 may be formed on a surface of the fin structure FS adjacent to the inner surface of the recess region R. The barrier layer 140 may be extended along the inner surface of the recess region R, and when viewed in a cross-sectional view, may be formed to have a U-shape as shown in the FIG. 10.

The barrier layer 140 may include germanium. In the case that the active pattern 120 and the source/drain regions SD may include germanium, the germanium concentration of the barrier layer 140 may be greater than that of the active pattern 120, and less than a maximum germanium concentration of each of the source/drain regions SD. In the case that each of the source/drain regions SD includes the first and second layers 150 and 152, and the first and second layers 150 and 152 include germanium, the germanium concentration of the barrier layer 140 may be greater than that of the first layer 150 and less than that of the second layer 152.

The barrier layer 140 may be formed by a preconditioning process that is performed before or while forming the source/drain regions SD. As an example, after the removal process of the upper portion of the second portion P2 (e.g., via a dry or wet etching process) to form the recess region R, a native oxide layer may be formed on the surface of the fin structure FS exposed by the recess region R. To remove the native oxide layer, the preconditioning process may be performed before or while forming the source/drain regions SD. The preconditioning process may include, e.g., a thermal treatment process or a plasma treatment process using a hydrogen gas. According to an example embodiment, the active pattern 120 and the buffer pattern 110b may include germanium. In this case, during the preconditioning process, the germanium may be segregated to, e.g., diffuse along, the surface of the fin structure FS exposed by the recess region R to define the barrier layer 140 with a high germanium concentration along the surface of the fin structure FS. The barrier layer 140 may be formed conformally along the exposed surface of the fin structure FS, i.e., along the exposed surface of the recess region R, to define the barrier layer 140 to have a thickness equal to or less than about 3 nm.

Figure 11:
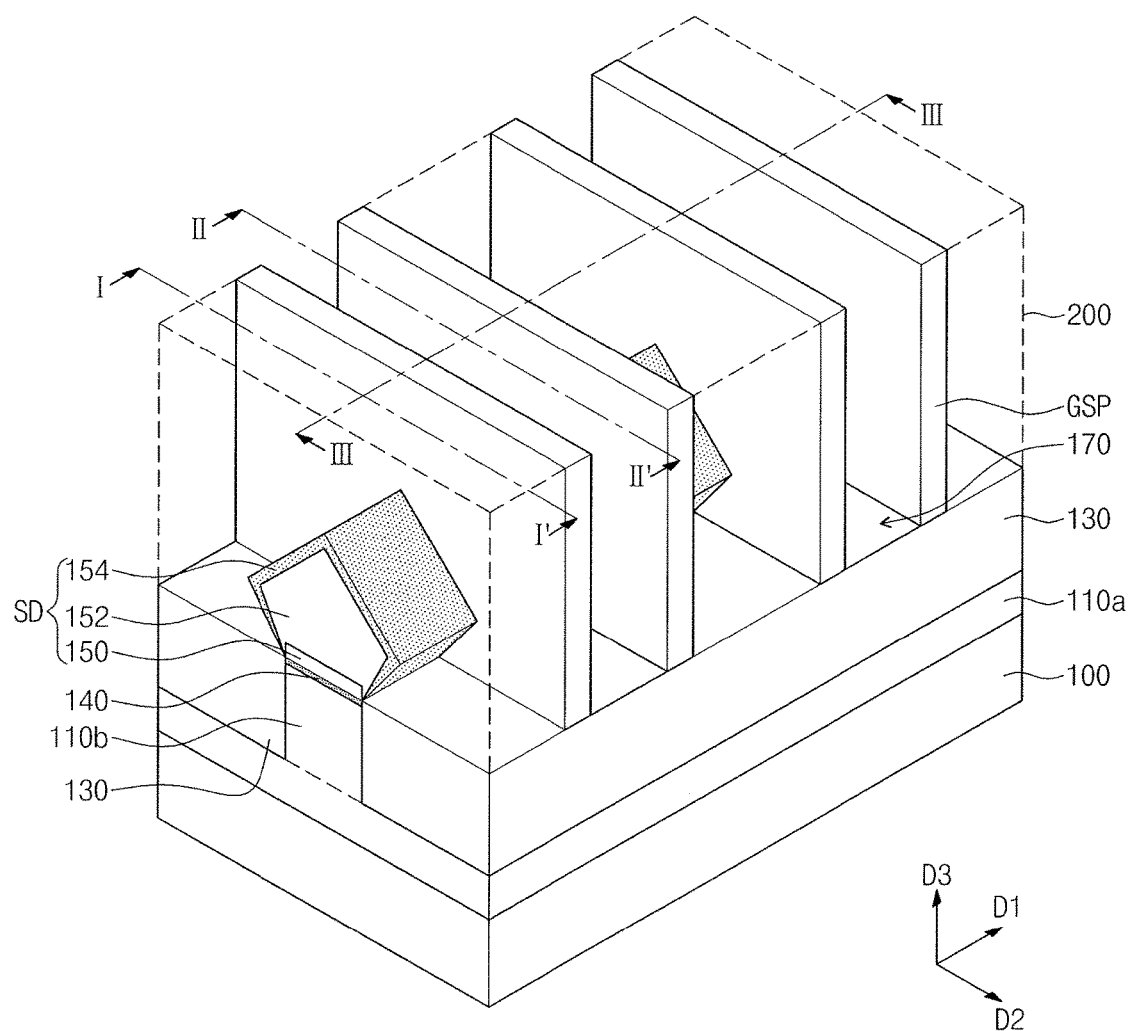
Figure 12:
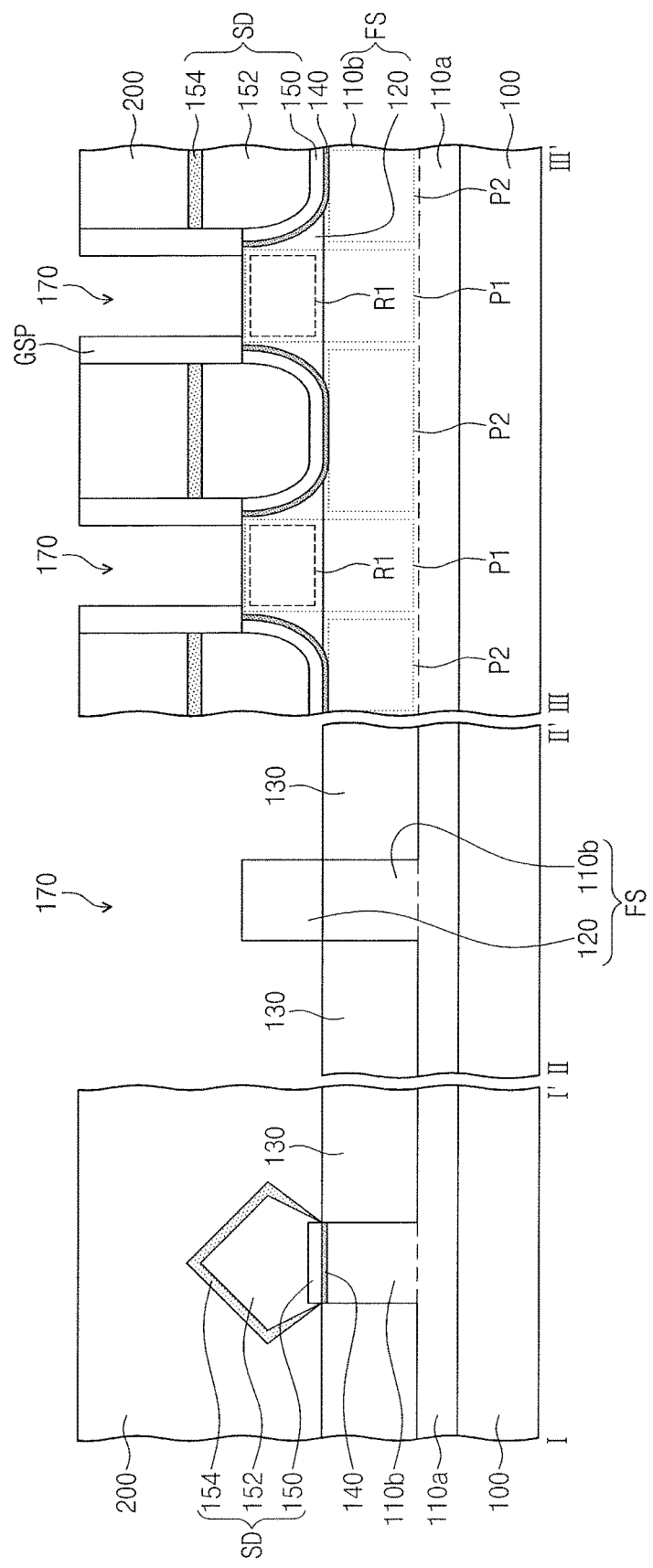

Referring to FIGS. 11 and 12, the lower interlayer insulating layer 200 may be formed on the substrate 100. The lower interlayer insulating layer 200 may be formed to cover the source/drain regions SD and the sacrificial gate pattern 160. The lower interlayer insulating layer 200 may include at least one of, e.g., a silicon oxide layer, a silicon nitride layer, a silicon oxynitride layer or a low-k dielectric layer.

The gate mask pattern 164, the sacrificial gate pattern 160, and the etch stop pattern 162 may be removed to form a gap region 170 between the gate spacers GSP. The gap region 170 may expose an upper portion of the first portion P1 (e.g., the active pattern 120). A portion of the lower interlayer insulating layer 200 may be etched during a removal of the gate mask pattern 164. The formation of the gap region 170 may include etching the sacrificial gate pattern 160 having an etch selectivity with respect to the gate spacers GSP, the lower interlayer insulating layer 200 and the etch stop layer 162. In addition, the formation of the gap region 170 may further include removal of the etch stop layer 162 to expose the upper portion of the first portion P1 of the fin structure FS.

Referring back to FIGS. 1 and 2, the gate insulating pattern GI and the gate electrode GE may be formed to fill the gap region 170. More specifically, a gate insulating layer (not shown) may be formed on the substrate to fill a portion of the gap region 170. The gate insulating layer may be formed to cover the upper portion of the first portion P1. The gate insulating layer may include at least one of, e.g., low-k dielectric layers. For example, the gate insulating layer may include at least one of, e.g., hafnium oxide, hafnium silicate, zirconium oxide or zirconium silicate. The gate insulating layer may be formed, e.g., by performing an atomic layer deposition process. A gate layer may be formed to fill the rest of the gap region 170. The gate layer may include at least one of conductive metal nitride (e.g., titanium nitride or tantalum nitride) and metal (e.g., aluminum or tungsten). The gate insulating layer and the gate layer sequentially stacked on the substrate may be planarized to form the gate insulating pattern GI and the gate electrode GE. Top surfaces of the lower interlayer insulating layer 200 and the gate spacers GSP may be exposed by the planarization process.

The gate insulating pattern GI may extend along a bottom surface of the gate electrode GE. The gate insulating pattern GI may be interposed between the gate electrode GE and the gate spacers GSP by extending on the opposite sidewalls of the gate electrode GE.

An upper portion of the gate electrode GE may be recessed so as to remain a desired thickness in the gap region 170. An upper portion of the gate insulating pattern GI may be also removed during the recess process. Accordingly, a recess region (not shown) may be defined in the gap region 170. A capping pattern CAP may be formed in the recess region 170. The formation of the capping pattern CAP may include forming a capping layer on the lower interlayer insulating layer 200 to fill the recess region 170, and planarizing the capping layer until exposing the lower interlayer insulating layer 200. The capping pattern CAP may include, e.g., a silicon nitride material. The gate insulating pattern GI, the gate electrode GE, the capping pattern CAP and the gate spacers GSP may define the gate structure GS.

In an embodiments, an upper interlayer insulating layer may be formed on the substrate including the gate structure GS. The upper interlayer insulating layer may include an oxide, nitride and/or oxynitride material. First contact holes penetrating the upper and lower interlayer insulating layers may be formed to expose the source/drain regions SD. Although not shown in the drawings, an upper portion of the source/drain regions may be partially removed by the etching process for forming the first contact holes. A second contact hole penetrating the upper and lower interlayer insulating layers may be formed to expose the gate electrode GE. Next, first contact plugs filling the first contact holes and a second contact plug filling the second contact hole may be formed. Wiring lines may be formed on the upper interlayer insulating layer to interconnect with the first and second contact plugs. The wiring lines may be configured to apply a voltage to the source/drain regions SD and the gate electrode GE through the first and second contact plugs. The first and second contact plugs and the wiring lines may include a conductive material.

Figure 13:
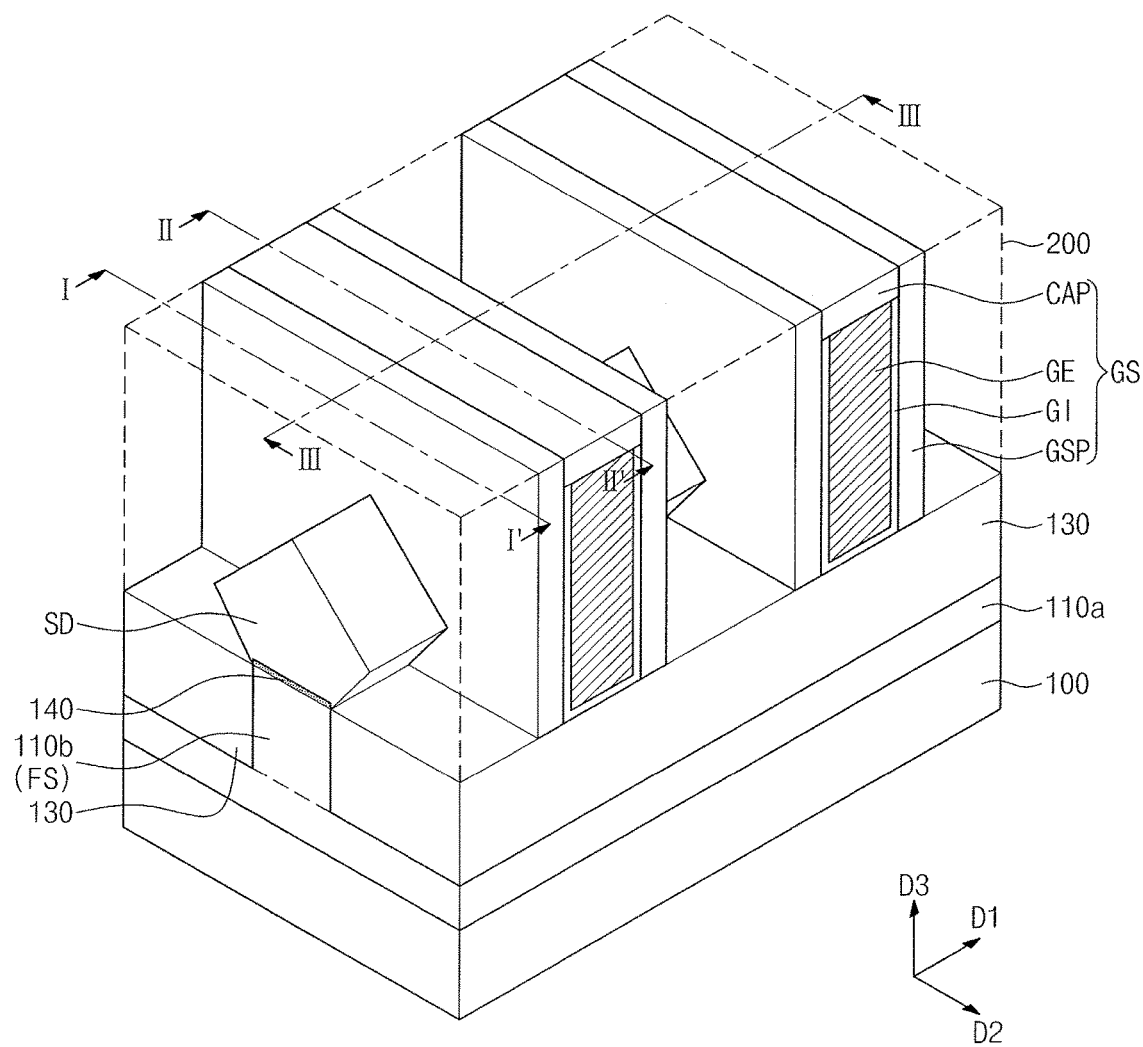
FIG. 13 illustrates a perspective view of a semiconductor device according to other embodiments.
Figure 14:
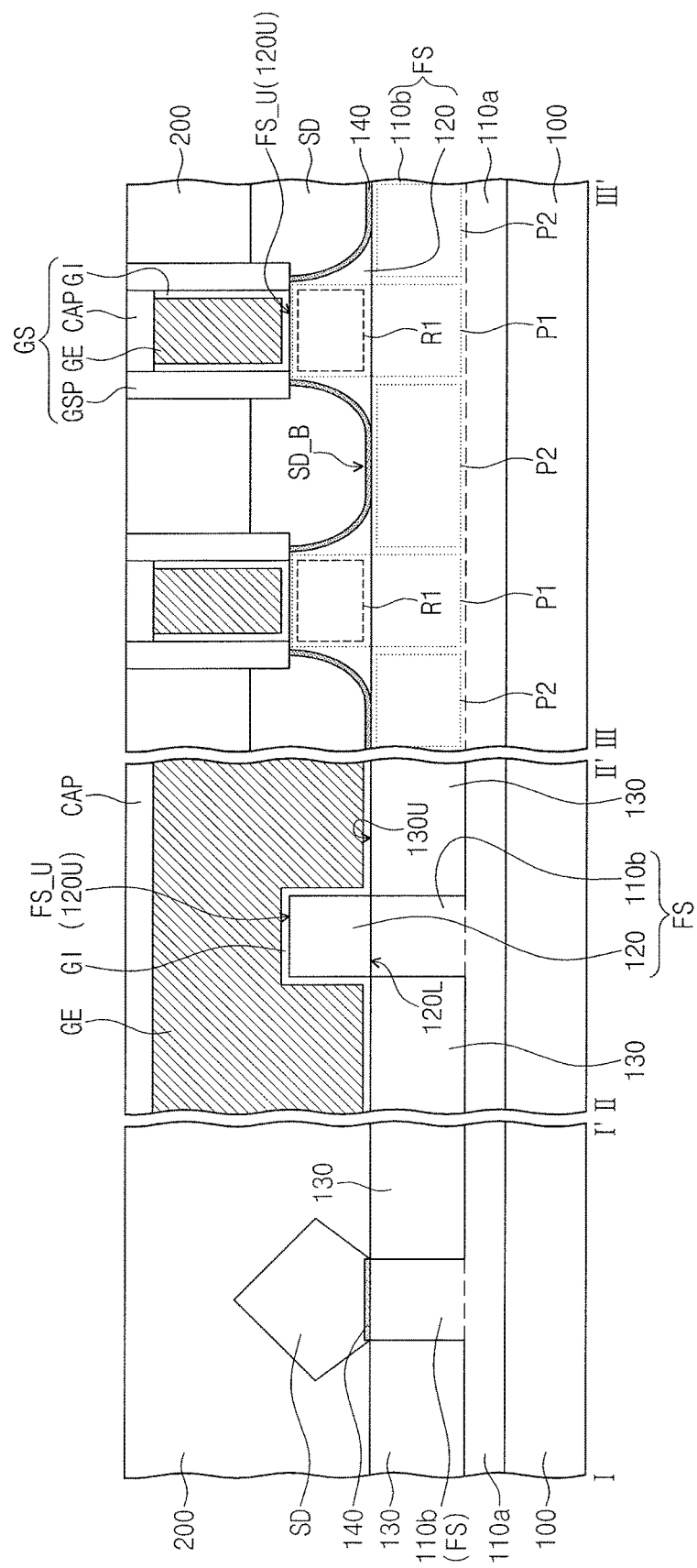
FIG. 14 illustrates a cross-sectional view taken along lines I-I', II-II', and III-III' of FIG. 13.

FIG. 13 is a perspective view illustrating a semiconductor device according to other embodiments, and FIG. 14 is a cross-sectional view taken along the lines I-I', II-II', and III-III' of FIG. 13.

Referring to FIGS. 13 and 14, the buffer layer 110a may be provided on the substrate 100. The buffer layer 110a may include a material having a lattice constant different from that of the substrate 100. The lattice constant of the buffer layer 110a may be greater than that of the substrate 100. As an example, in the case that the substrate 100 is a silicon substrate, the buffer layer 110a may include a silicon-germanium layer on the substrate 100.

The fin structure FS may be provided on the buffer layer 110a extending in the first direction D1. The fin structure FS may include the buffer pattern 110b protruding from the buffer layer in the third direction D3 110a and the active pattern 120 disposed on the buffer pattern 110b. The buffer pattern 110b may extend in the first direction D1 and the active pattern 120 may be provided on the top surface of the buffer pattern 110b.

The buffer pattern 110b may include the same material as the buffer layer 110a and the lattice constant of the buffer pattern 110b may be the same as that of the buffer layer 110a. The buffer pattern 110b and buffer layer 110a may be a portion of a single layer connected to each other.

The active pattern 120 may include a material having a lattice constant different from that of the buffer pattern 110b.

According to example embodiments, the lattice constant of the active pattern 120 may be less than that of the buffer pattern 110b. Accordingly, the buffer pattern 110b may apply tensile stress to the active pattern 120. As an example, the buffer pattern 110b may include silicon-germanium (SiGe) and the active pattern 120 may include silicon (Si).

Device isolation layers 130 may be provided at both sides of the fin structure FS. The device isolation layers 130 may be provided on the buffer layer 110a and may extend in the first direction D1. The device isolation layers 130 may be spaced apart from each other along the second direction D2 with the fin structure FS interposed therebetween.

The device isolation layer 130 may expose the upper portion of the fin structure FS. Each of the device isolation layer 130 may expose a portion of sidewall of the fin structure FS. That is, the fin structure FS may have sidewalls exposed by the device isolation layers 130. Each of top surfaces 130U of the device isolation layer 130 may be positioned at a lower level than a top surface FS_U of the fin structure FS.

At least a portion of the active pattern 120 may be exposed by the device isolation layer 130. Each of the device isolation layer 130 may expose at least a portion of the sidewall of the active pattern 120. That is, the active pattern 120 may have sidewalls exposed by the device isolation layer 130. Each of the top surfaces 130U of the device isolation layers 130 may be positioned at a lower level than a top surface of the active pattern 120. In some example embodiments, as shown in the FIG. 14, each of the top surfaces 130U of the device isolation layers 130 may be substantially coplanar with a bottom surface 120L of the active pattern 120. In other example embodiments, unlike that shown in FIG. 14, each of the top surfaces 130U of the device isolation layer 130 may be positioned at a lower or higher level than the bottom surface 120L of the active pattern 120.

The gate structure GS may be provided on the substrate 100 to cross over the fin structure FS. The gate structure GS may extend in the second direction D2. The active pattern 120 may be provided between the buffer pattern 110b and the gate structure GS. In some example embodiments, the active pattern 120 may be locally provided under the gate structure GS.

The fin structure FS may include the first portion P1 under the gate structure GS and the second portions P2 at both sides of the gate structure GS. The top surface of the first portion P1 may be positioned at a higher level than that of the second portion P2. That is, the top surface FS_U of the fin structure FS may be the top surface of the first portion P1. The first portion P1 of the fin structure FS may have sidewalls exposed by the device isolation layer 130. The gate structure GS may cover the top surface of the first portion P1 and the exposed sidewalls and extend over the top surfaces 130U of the device isolation layers 130.

The first portion P1 of the fin structure FS may include the active pattern 120. The active pattern 120 may have sidewalls exposed by the device isolation layer 130. The gate structure GS may cover the top surface 120U of the active pattern 120 and the exposed sidewalls and extend over the top surfaces 130U of the device isolation layers 130.

The active pattern 120 may serve as a channel region of a transistor including the gate structure GS. In this case, the transistor may be an N-type transistor.

The gate structure GS may include the gate electrode GE extending in the second direction D2, the gate insulating pattern GI which is interposed between the gate electrode GE and the fin structure FS and extends between each of the device isolation layers 130 and the gate electrode GE, and the capping pattern CAP extending along the top surface of the gate electrode GE. The gate structure GS may further include gate spacers GSP provided on opposite sidewalls of the gate electrode GE. The gate insulating pattern GI may extend between the gate electrode GE and the gate spacers GSP.

Source/drain regions SD may be provided on the fin structure FS at both sides of the gate structure GS. The Source/drain regions SD may be disposed on the second portions P2 of the fin structure FS, respectively. The source/drain regions SD may be horizontally spaced apart from each other with the active pattern 120 interposed therebetween. Each of bottom surfaces SD_B of the source/drain regions SD may be positioned at a lower level than the top surface 120U of the active pattern 120.

The source/drain regions SD may include a material having a lattice constant the same as or less than that of the active pattern 120. In the case that the source/drain regions SD may include the material having the lattice constant less than that of the active pattern 120, the source/drain regions SD may provide tensile stress for the active pattern 120. For example, the source/drain regions SD may include silicon (Si) or silicon-carbide (SiC)

Each of the source/drain regions SD may further include an impurity. The impurity may be used to improve electrical characteristics of a transistor including the source/drain regions SD. In the case that the transistor is an N-type transistor, the impurity may be, e.g., phosphorus.

The barrier layer 140 may be interposed between each of the source/drain regions SD and the fin structure FS. The barrier layer 140 may be interposed between each of the source/drain regions SD and each of the second portions P2 of the fin structure FS, and may extend between each of the source/drain regions SD and the first portion P1 of the fin structure FS. A pair of barrier layers 140 may be provided at both sides of the gate structure GS, respectively. That is, the pair of barrier layers 140 may be provided on the second portions P2 of the fin structure FS, respectively. The pair of barrier layers 140 may be horizontally spaced apart from each other with the active pattern 120 interposed therebetween.

According to example embodiments, the barrier layer 140 may include an element different from an element that composes the source/drain regions SD and the active pattern 120. The barrier layer 140 may include germanium. A thickness of the barrier layer 140 may be, e.g., equal to or less than 3 nanometers.

According to example embodiments, the barrier layer 140 may be interposed between the source/drain regions SD and the active pattern 120, and may include germanium. The barrier layer with germanium 140 may suppress diffusion of the impurity from the source/drain regions SD into the active pattern 120. Accordingly, the electrical characteristics of the transistor with the source/drain regions SD may be improved.

The lower interlayer insulating layer 200 may be provided on the substrate 100 to cover the gate structure GS and the source/drain regions SD. Although not shown in the drawings, an upper interlayer insulating layer (not shown) may be disposed on the substrate including the gate structure GS. First contact plugs (not shown) penetrating the upper and lower interlayer insulating layers may be provided to be electrically connected to the source/drain regions SD. A second contact plug (not shown) penetrating the upper and lower interlayer insulating layers may be provided to be electrically connected to the gate electrode GE. Wiring lines (not shown) may be disposed on the upper interlayer insulating layer to be connected to the first and second contact plugs. The wiring lines may apply a voltage to the source/drain regions SD and the gate electrode GE through the first and second contact plugs. The first and second contact plugs and the wiring lines may include conductive materials.

Figure 15:
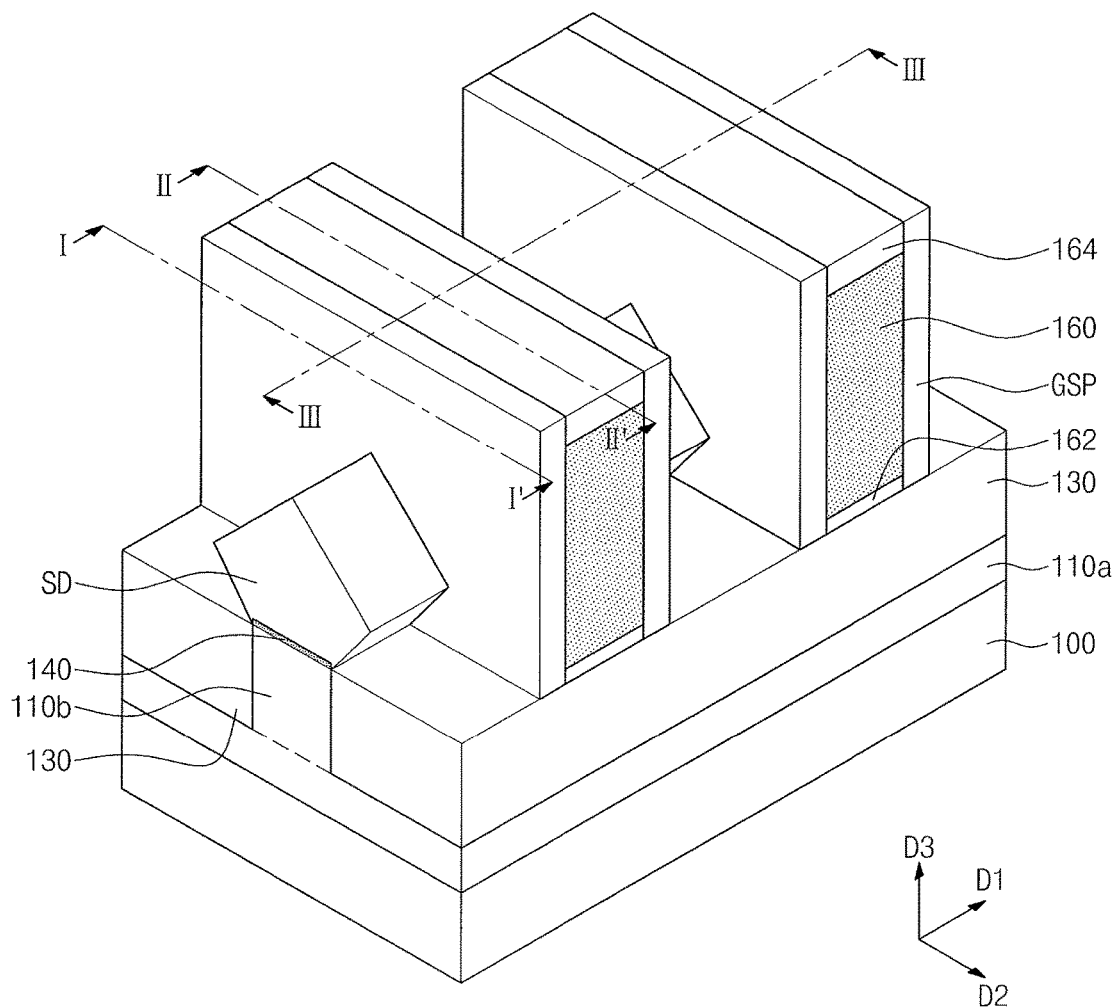
FIG. 15 illustrates a perspective view of a method of manufacturing a semiconductor device according to other embodiments.
Figure 16:
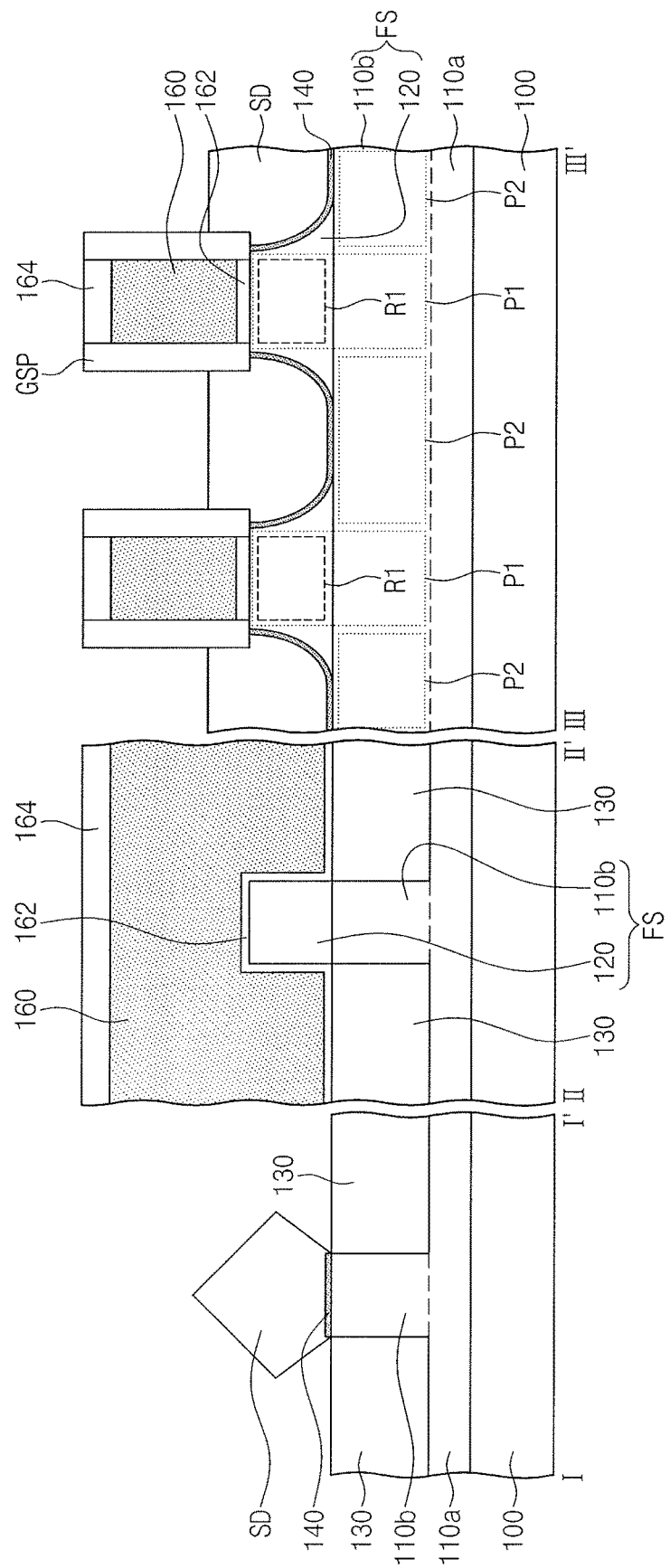
FIG. 16 illustrates a cross-sectional view taken along lines I-I', II-II', and III-III' of FIG. 15.

FIG. 15 is a perspective view illustrating a method of manufacturing a semiconductor device according to other embodiments, and FIG. 16 is a cross-sectional view taken along the lines I-I', II-II' and III-III' of FIG. 15. In the following descriptions, elements previously described with reference to FIGS. 3 to 12 may be identified by similar or identical reference numbers without repeating and overlapping descriptions thereof.

As previously described with reference to FIGS. 3 and 4, the buffer layer 110a may be formed on the substrate 100. The fin structure FS may be formed on the buffer layer 110a to extend in the direction D1. The fin structure FS may include the buffer pattern 110b protruding from the buffer layer 110a and extending in the first direction D1, and the active pattern 120 provided on the top surface of the buffer pattern 110b and extending in the first direction D1. Forming the fin structure FS may include sequentially forming a preliminary buffer layer (not shown) and an active layer (not shown), and forming trenches T to define the fin structure FS by patterning the preliminary buffer layer and the active layer. The trenches T may have a line shape extending the first direction D1.

The preliminary buffer layer may include a material having a lattice constant different from that of the substrate 100. A lattice constant of the preliminary buffer layer may be greater than that of the substrate 100. In the case that the substrate 100 is a silicon substrate, the preliminary buffer layer may include silicon-germanium.

The active layer may include a material having a lattice constant different from that of the preliminary buffer layer. According to example embodiments, a lattice constant of the active layer may be less than that of the preliminary buffer layer. As an example, the preliminary buffer layer may include silicon-germanium, and the active layer may include silicon. Accordingly, the preliminary buffer layer may provide tensile stress for the active layer.

Device isolation layers 130 may be formed at both sides of the fin structure FS. The device isolation layers 130 may be formed to fill the trenches T. An upper portion of the fin structure FS may be exposed by recessing an upper portion of the device isolation layers 130. At least a portion of the active pattern 120 may be exposed after performing the recess process of the device isolation layers 130.

Next, as previously described with reference to FIGS. 5 and 6, the sacrificial gate pattern 160 may be formed to cross over the fin structure FS. A gate mask pattern 164 may be formed to extend along a top surface of the sacrificial gate pattern 160. The etch stop pattern 162 may be formed to extend along a bottom surface of the sacrificial gate pattern 160.

As the sacrificial gate pattern 160 may be formed to cross over the fin structure FS, the first portion P1 and the second portion P2 may be defined in the fin structure FS. The first portion P1 may be located under the sacrificial gate pattern 160 and may be a portion of the fin structure that overlaps the sacrificial gate pattern when viewed from a plan view. The second portions P2 may be located at both sides of the sacrificial gate pattern 160 and may be other portions of the fin structure FS horizontally separated by the first portion P1.

In addition, as the sacrificial gate pattern 160 may be formed to cross over the fin structure FS, the first region R1 and the second region R2 may be defined in the active pattern 120. The first region R1 may be located under the sacrificial gate pattern 160 and, when viewed in a plan view, may be the region of the active pattern 120 that overlaps with the sacrificial gate pattern 160. The second regions R2 may be located at both sides of the sacrificial gate pattern 160 and may be regions of the active pattern 120 horizontally separated by the active pattern 120. The first region R1 of the active pattern 120 may be an upper portion of the first portion P1 of the fin structure FS, and each of the second regions R2 of the active pattern 120 may be an upper portion of each of the second portions P2. Gate spacers GSP may be formed on opposite sidewalls of the sacrificial gate pattern 160.

As previously described with reference to FIGS. 7 and 8, the upper portion of the second portion P2 may be removed to form the recess region R in the fin structure FS. Accordingly, the top surface of the second portion P2 may be positioned at lower level than that of the first portion P1. At least a portion of the second region R2 of the active pattern 120 may be removed by the removal process.

According to some example embodiments, the recess region R may extend under the gate spacers GSP. That is, when viewed in a plan view, the recess region R may partially overlap the gate spacers GSP. As shown in the FIG. 8, when viewed in a cross-sectional view, the recess region R may be formed to have a U-shape.

Referring to FIGS. 15 and 16, barrier layers 140 may be formed at both sides of the sacrificial gate pattern 160. The barrier layers 140 may be formed on the second portions P2 of the fin structure FS. Each of the barrier layers 140 may be formed to fill a portion of the recess region R. Each of the barrier layers 140 may conformally cover an inner surface of the recess region R. Each of the barrier layers 140 may extend along the inner surface of the recess region R. Accordingly, as shown in the FIG. 16, when viewed in a cross-sectional view, the recess region R may be formed to have a U-shape.

As an example, the barrier layers 140 may be formed by performing a selective epitaxial growth process using a surface of the fin structure FS as a seed. As other example, the barrier layers 140 may be formed using a chemical vapor deposition (CVD) or molecular beam epitaxy (MBE) processes. The barrier layers 140 may include germanium. The barrier layers 140 may be formed to have a thickness equal to or less than 3 nm.

Next, source/drain regions SD may be formed at both sides of the sacrificial gate pattern 160. The source/drain regions SD may be formed on the second portions P2 of the fin structure FS, respectively. Each of the source/drain regions SD may be formed to fill the rest of the recess region R. The formation of the source/drain regions SD may include performing the selective epitaxial growth process using the barrier layers 140 as a seed.

According to example embodiments, the source/drain regions SD may include a material having a lattice constant the same as or less than that of the active pattern 120. For example, the source/drain regions SD may include silicon (Si) or silicon-carbide (SiC).

The formation of the source/drain regions SD may further include doping an impurity in the source/drain regions SD while or after performing the selective epitaxial growth process. The impurity may include, for example, phosphorous (P).

The subsequent manufacturing process is substantially the same as the method of manufacturing the semiconductor device according to example embodiments described with reference to FIGS. 1, 2, 11, and 12.

According to example embodiments, the barrier layer 140 may be interposed between the source/drain regions SD and the active pattern 120, and may include a high concentration of germanium. The barrier layer 140 with a high concentration of germanium may suppress a diffusion of the impurity from the source/drain regions SD into the active pattern 120. Accordingly, the electrical characteristics of the transistor may be improved.

Figure 17:
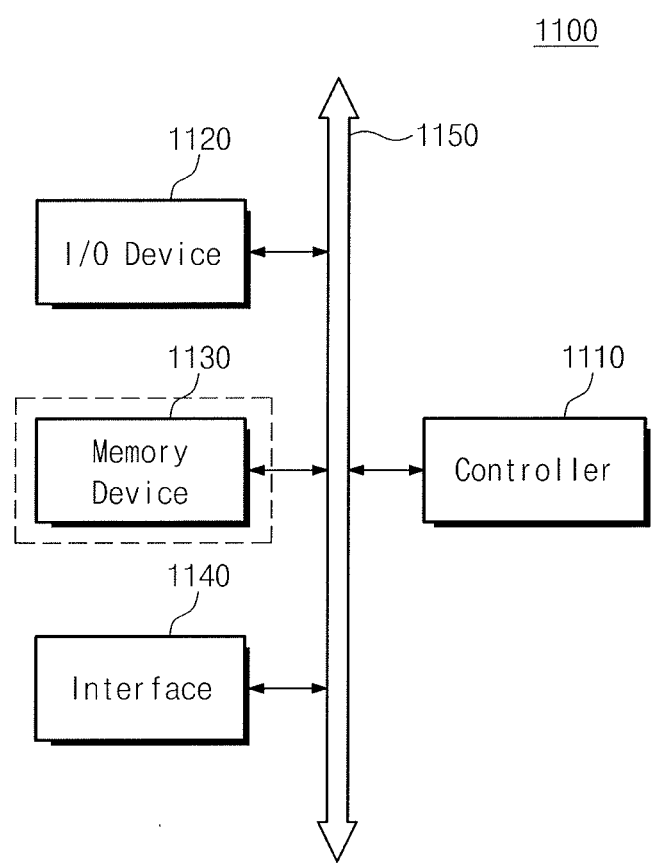
FIG. 17 illustrates a block diagram of an electronic system including a semiconductor device in accordance with some embodiments.

FIG. 17 is a block diagram of an electronic system including a semiconductor device in accordance with some embodiments of the inventive concept.

Referring to FIG. 17, the electronic system 1100 may include a controller 1110, an input/output device 1120, a memory device 1130, an interface 1140, and a bus 1150. The controller 1110, the input/output device 1120, the memory device 1130, and/or the interface 1140 can combine, e.g., communicate, with one another through the bus 1150. The bus 150 is a path through which data moves.

The controller 1110 may include at least one of, e.g., a microprocessor, a digital signal process, a micro controller and logical devices that can perform functions similar thereto. The input/output device 1120 may include, e.g., a keypad, a keyboard and a display device. The memory device 1130 can store data and/or commands. The memory device 1130 may include a nonvolatile memory device, e.g., a flash memory device, a phase change memory device, and/or a magnetic memory device. In addition, the memory device 1130 may further include a volatile memory device. In this case, the memory device 1130 may include a SRAM (Static Random Access Memory) device including a semiconductor device according to example. The interface 140 can perform a function of transmitting data to a communication network or receiving data from a communication network. The interface 1140 may have a wired or wireless form. For instance, the interface 1140 may include an antenna or a wired/wireless transceiver. The semiconductor device in accordance with some embodiments of the inventive concept may be provided in the memory device 1130 or may be provided as a part of the controller 1110 and the input/output device 1120. Although not illustrated, the electronic system 1100 may further include a high speed DRAM and/or SRAM as an operation memory for improving an operation of the controller 1110.

Figure 18:
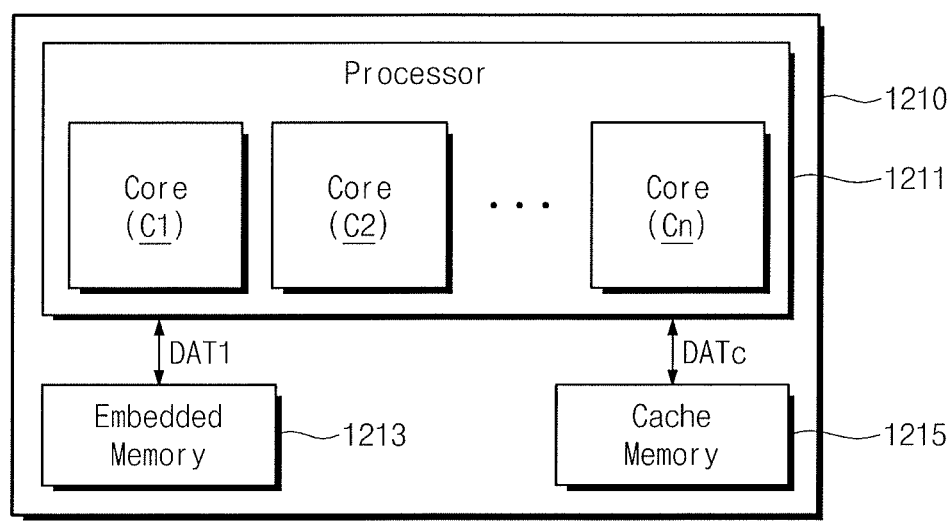
FIG. 18 illustrates a block diagram showing an electronic device including a semiconductor device according to example embodiments.

FIG. 18 is a block diagram showing the configuration of an electronic device including a semiconductor device according to example embodiments.

Referring to FIG. 18, the electronic device 1200 may include a semiconductor chip 1210. The semiconductor chip 1210 may include a processor 1211, an embedded memory 1213 and a cache memory 1215.

The processor 1211 may include one or more processor cores C1-Cn. The one or more processor cores C1-Cn may process a data and a signal. The processor cores C1-Cn may include a semiconductor device in accordance with embodiments.

The electronic device 1200 may perform a specific function using the processing data and the signal. The processor 1211 may be an application processor.

The embedded memory 1213 may exchange a first data DATA1 with the processor 1211. The first data DATA1 may be the data being processed or to be processed by the one or more processor cores C1-Cn. The embedded memory 1213 may manage the first data DATA1. For example, the embedded memory 1213 may buffer the first data DATA1. That is, the embedded memory 1213 may operate as a buffer memory or a working memory of the processor 1211.

According to an embodiment, the electronic device 1200 may be applied to a wearable device.

The embedded memory 1213 may be a SRAM (Static Random Access Memory). The SRAM may operate at a faster speed than a DRAM (Dynamic Random Access Memory). When the SRAM is embedded in the semiconductor chip 1210, the electronic device 1200 may have a small size and may operate at a high speed. The SRAM may include the semiconductor device according to embodiments.

The cache memory 1215 with the one or more processor cores C1 through Cn may be mounted on the semiconductor chip 1210. The cache memory 1215 may storage a cache data DATc. The cache data DATc may be a data using the one or more processor cores C1 through Cn. The cache memory 1215 may include SRAM (Static Random Access Memory) including the semiconductor device according to embodiments.

For ease of understanding, the cache memory 1215 is shown as a separate component. But the processor 1211 may be configured to include the cache memory 1215.

The processor 1211, the embedded memory 1213 and the cache memory 1215 may transmit a data based on a variety of interface protocols. For example, the processor 1211, the embedded memory 1213 and the cache memory 1215 may transmit the data based on at least one of USB (Universal Serial Bus), SCSI (Small Computer System Interface), PCI (Peripheral Component Interconnect) Express, ATA (Advanced Technology Attachment), PATA (Parallel ATA), SATA (Serial ATA), SAS (Serial Attached SCSI), IDE (Integrated Drive Electronics), UFS (Universal Flash Storage).

Figure 19:
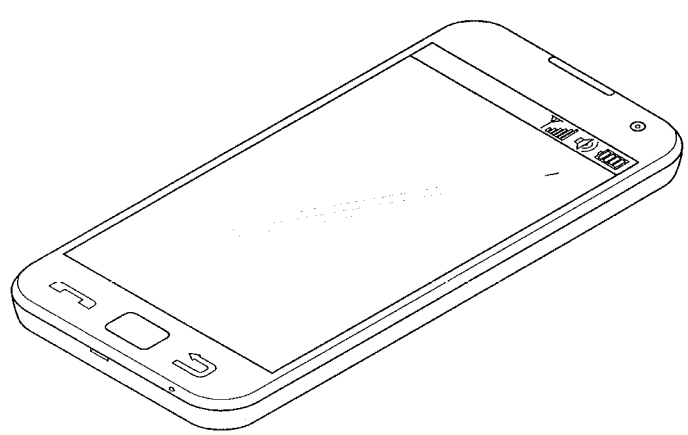
FIGS. 19 to 21 illustrate perspective views of multimedia devices including semiconductor devices according to embodiments.
Figure 20:
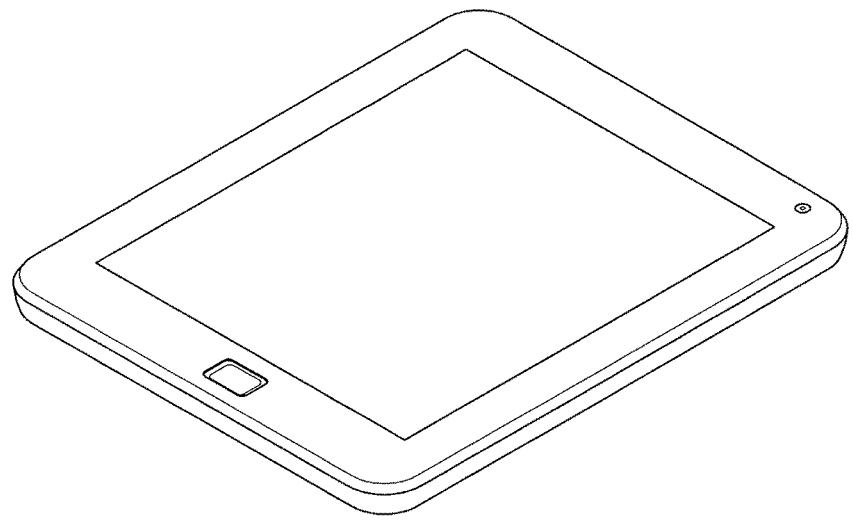
Figure 21:
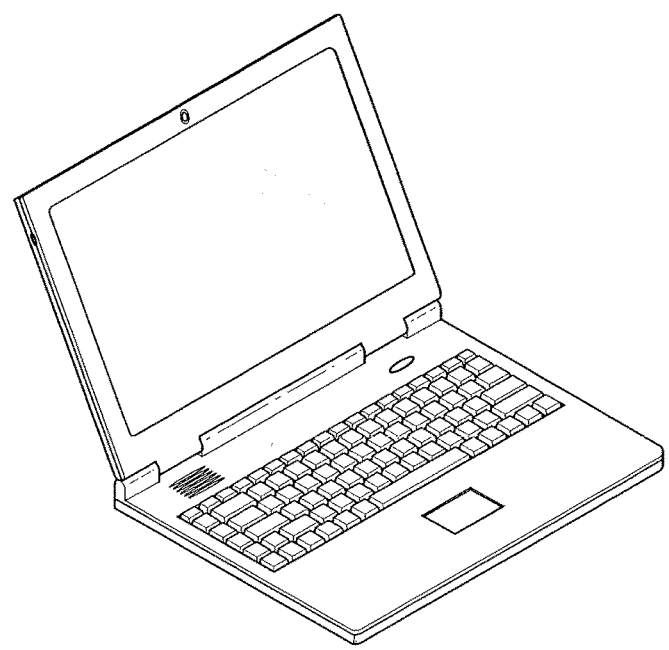

FIGS. 19 to 21 are perspective views illustrating multimedia devices including semiconductor devices according to embodiments. The electronic system 1100 of FIG. 17 and/or the electronic device 1200 of FIG. 18 may be applied to a mobile phone or a smart phone 2000 shown in FIG. 19, may be applied to a tablet or a smart tablet 3000 shown in FIG. 20, and may be applied to a notebook computer 4000 shown in FIG. 21.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a fin structure on a substrate and extending in a first direction;
   a gate electrode crossing over the fin structure, the fin structure including a first portion under the gate electrode and second portions at opposite sides of the gate electrode;
   source/drain regions on the second portions of the fin structure, respectively; and a barrier layer between each of the source/drain regions and a corresponding second portion and extending between each of the source/drain regions and the first portion,
wherein the fin structure includes a material having a lattice constant different from that of the substrate,
wherein the fin structure, the source/drain regions, and the barrier layer include germanium, and
wherein a germanium concentration in the barrier layer is greater than that in the fin structure and less than a maximum germanium concentration in each of the source/drain regions.

2. The semiconductor device as claimed in claim 1, wherein:
each of the source/drain regions includes a first layer and a second layer sequentially stacked on the barrier layer, the first layer being between the barrier layer and the second layer, and
the germanium concentration in the barrier layer is greater than that of the first layer and less than that of the second layer.

3. The semiconductor device as claimed in claim 1, wherein top surfaces of the second portions are positioned at a lower level than a top surface of the first portion.

4. The semiconductor device as claimed in claim 1, further comprising a buffer layer between the substrate and the fin structure,
wherein the fin structure includes:
a buffer pattern protruding from the buffer layer and extending in the first direction, and
an active pattern between the buffer pattern and the gate electrode, the active pattern including germanium, and
wherein the germanium concentration in the barrier layer is greater than that of the active pattern.

5. The semiconductor device as claimed in claim 4, wherein:
the buffer layer includes a material having a lattice constant different from that of the substrate, and
the buffer layer and the buffer pattern include a same material having a same lattice constant, the buffer layer and the buffer pattern applying a compressive stress to the active pattern.

6. The semiconductor device as claimed in claim 5, wherein the buffer layer and the buffer pattern include germanium, a germanium concentration in the buffer layer and the buffer pattern being less than that of the active pattern.

7. The semiconductor device as claimed in claim 4, further comprising device isolation layers on the buffer layer, the device isolation layers being at two sides of the fin structure,
wherein the active pattern has sidewalls exposed by the device isolation layers, and
wherein the gate electrode covers a top surface and the exposed sidewalls of the active pattern, the gate electrode extending over top surfaces of the device isolation layers.

8. A semiconductor device, comprising:
a buffer layer on a substrate, the buffer layer having a lattice constant different from that of the substrate;
a fin structure protruding from the buffer layer;
a gate electrode crossing over the fin structure;
source/drain regions on the fin structure at opposite sides of the gate electrode; and
a barrier layer between each of the source/drain regions and the fin structure, the barrier layer including germanium.

9. The semiconductor device as claimed in claim 8, wherein:
the fin structure includes a first portion under the gate electrode and second portions at opposite sides of the gate electrode,
top surfaces of the second portions are at lower level than a top surface of the first portion, and
the source/drain regions are on the second portions, respectively.

10. The semiconductor device as claimed in claim 9, wherein the barrier layer is between each of the source/drain regions and a corresponding second portion, the barrier layer extending between each of the source/drain regions and the first portion.

11. The semiconductor device as claimed in claim 10, wherein the fin structure includes:
a buffer pattern protruding from the buffer layer and extending in a first direction parallel to an upper surface of the substrate; and
an active pattern between the buffer pattern and the gate electrode, the active pattern including a material having a lattice constant different from that of the buffer pattern.

12. The semiconductor device as claimed in claim 11, wherein the buffer layer and the buffer pattern include a same material having a same lattice constant, the buffer layer and the buffer pattern applying a tensile stress to the active pattern.

13. The semiconductor device as claimed in claim 12, wherein the barrier layer includes an element different from an element that composes the source/drain regions and the active pattern.

14. The semiconductor device as claimed in claim 11, wherein the buffer layer and the buffer pattern include a same material having a same lattice constant, the buffer layer and the buffer pattern applying a compressive stress to the active pattern.

15. The semiconductor device as claimed in claim 14, wherein the active pattern and the source/drain regions include germanium, a germanium concentration of the barrier layer being greater than that of the fin structure and less than a maximum germanium concentration of each of the source/drain regions.

16. The semiconductor device as claimed in claim 15, wherein:
each of the source/drain regions includes a first layer and a second layer sequentially stacked on the barrier layer, the first layer being between the barrier layer and the second layer, and
the germanium concentration of the barrier layer is greater than that of the first layer and less than that of the second layer.

17. A semiconductor device, comprising:
a buffer layer on a substrate;
a fin structure protruding directly from the buffer layer, the fin structure including an active pattern;
a gate electrode crossing over the fin structure, the active pattern of the fin structure being between the buffer layer and the gate electrode;
source/drain regions on the fin structure at opposite sides of the gate electrode; and
a barrier layer between each of the source/drain regions and the fin structure, the barrier layer overlapping sidewalls of the active pattern.

18. The semiconductor device as claimed in claim 17, wherein the barrier layer extends continuously along a bottom of each of the source/drain regions and along an entirety of sidewalls of the active pattern.

19. The semiconductor device as claimed in claim 18, wherein the barrier layer and the active pattern include germanium, a germanium concentration in the barrier layer being greater than that of the active pattern.

* * * * *